United States Patent
Goujard et al.

(10) Patent No.: US 9,828,670 B2
(45) Date of Patent: Nov. 28, 2017

(54) LOADER DEVICE AND AN INSTALLATION FOR DENSIFYING STACKABLE FRUSTOCONICAL POROUS PREFORMS

(71) Applicant: HERAKLES, Le Haillan (FR)

(72) Inventors: Stephane Goujard, Merignac (FR); Sebastien Bertrand, Moulis en Medoc (FR); Adrien Delcamp, Merignac (FR); Franck Beauvais, Saint Medard en Jalles (FR)

(73) Assignee: HERAKLES, Le Haillan (FR)

(*) Notice: Subject to any disclaimer, the term of this patent is extended or adjusted under 35 U.S.C. 154(b) by 401 days.

(21) Appl. No.: 14/411,575

(22) PCT Filed: Jul. 3, 2013

(86) PCT No.: PCT/FR2013/051562
§ 371 (c)(1),
(2) Date: Dec. 29, 2014

(87) PCT Pub. No.: WO2014/006324
PCT Pub. Date: Jan. 9, 2014

(65) Prior Publication Data
US 2015/0152545 A1 Jun. 4, 2015

(30) Foreign Application Priority Data
Jul. 4, 2012 (FR) ................................ 12 56407

(51) Int. Cl.
*C23C 16/04* (2006.01)
*C23C 16/458* (2006.01)
(Continued)

(52) U.S. Cl.
CPC .......... *C23C 16/045* (2013.01); *C04B 35/806* (2013.01); *C04B 35/83* (2013.01);
(Continued)

(58) Field of Classification Search
CPC ....................... C23C 16/045; C04B 2235/614
See application file for complete search history.

(56) References Cited

U.S. PATENT DOCUMENTS 5,904,957 A 5/1999 Christin et al.
7,182,980 B2 2/2007 Goujard et al.
(Continued)

FOREIGN PATENT DOCUMENTS

WO 2006077353 A1 7/2006

OTHER PUBLICATIONS

International Search Report for corresponding International PCT Application No. PCT/FR2013/051562, dated Sep. 10, 2013.

*Primary Examiner* — Karla A Moore
*Assistant Examiner* — Nathan K Ford
(74) *Attorney, Agent, or Firm* — Workman Nydegger

(57) ABSTRACT

A loader device is arranged for densifying porous preforms of stackable shape by means of directed stream chemical vapor infiltration in a reaction chamber of an infiltration oven. The device comprises a support tray, a first stack having a plurality of bottom rings arranged on the support tray and a plurality of injection orifices, a second stack comprising a plurality of top rings and a plurality of discharge orifices extending between the outer periphery and inner periphery of each ring. The device includes a first non-porous wall corresponding to the porous preforms and arranged on the support tray inside the bottom rings of the first stack, and a second non-porous wall corresponding to the porous preforms extending between the bottom ring situated at the top of the first stack and the top ring situated at the top of the second stack.

9 Claims, 21 Drawing Sheets

(51) Int. Cl.
*C23C 16/455* (2006.01)
*C23C 16/46* (2006.01)
*C04B 35/80* (2006.01)
*C04B 35/83* (2006.01)

(52) U.S. Cl.
CPC .......... *C23C 16/455* (2013.01); *C23C 16/458* (2013.01); *C23C 16/46* (2013.01); *C04B 2235/614* (2013.01); *C04B 2235/94* (2013.01)

(56) References Cited

U.S. PATENT DOCUMENTS

| | | |
|---|---|---|
| 8,084,079 B2 | 12/2011 | Thebault et al. |
| 2004/0237898 A1* | 12/2004 | Bernard .................. C04B 35/83 118/724 |
| 2008/0160192 A1 | 7/2008 | Thebault et al. |

* cited by examiner

LOADER DEVICE AND AN INSTALLATION FOR DENSIFYING STACKABLE FRUSTOCONICAL POROUS PREFORMS

BACKGROUND OF THE INVENTION

The present invention relates to the chemical vapor infiltration techniques that are used in particular when making parts out of thermostructural composite material. The invention relates more particularly to depositing matrix material in order to densify porous preforms of frustoconical shape, such as fiber preforms for use in fabricating the diverging portions of rocket engines or parts for aeroengine afterburners.

In order to fabricate parts out of composite material, in particular parts made of thermostructural composite material constituted by a refractory fiber preform (e.g. made of carbon fibers or ceramic fibers) that is densified by a refractory matrix (e.g. made of carbon and/or ceramic), it is common practice to make use of chemical vapor infiltration methods. Examples of such parts are thruster nozzles made of carbon-carbon (C—C) composite material, brake disks, in particular for airplane brakes, made of C—C composite materials, and ceramic matrix composite (CMC) turbine blades.

Densifying porous preforms by chemical vapor infiltration consists in placing the substrates in a reaction chamber of an infiltration installation by means of support tooling, and in admitting a reagent gas into the chamber, which gas has one or more components that are precursors for the material that is to be deposited within the preforms in order to densify them. Infiltration conditions, in particular the composition and the flow rate of the reagent gas, and also the temperature and the pressure inside the chamber, are selected so as to enable the gas to diffuse within the accessible internal pores of the preforms so that the desired material is deposited therein by a component of the gas decomposing or by reaction between a plurality of components of the gas. The reagent gas is usually preheated by being passed through a preheater zone situated in the reaction chamber and into which the reagent gas inlet leads. That method corresponds to the free flow chemical vapor infiltration method.

In an industrial installation for chemical vapor infiltration, it is common practice to load the reaction chamber with a plurality of preforms to be densified simultaneously in order to increase the throughput of the densification process, and consequently to increase the specific loading of reaction chambers.

Methods and installations for densifying porous annular substrates by chemical vapor infiltration are described in particular in U.S. Pat. No. 7,182,980 and U.S. Pat. No. 5,904,957. Nevertheless, those methods rely essentially on densifying substrates of annular shape arranged in stacks and, in terms of optimizing loading, they are not suitable for densifying preforms of frustoconical shape and of large dimensions. As described in U.S. Pat. No. 7,182,980 and U.S. Pat. No. 5,904,957, it is necessary to leave a large amount of space between each frustoconical preform in the reaction chamber so as to enable the infiltration gas to feed every portion of the preforms for densifying in a manner that is satisfactory, thereby significantly reducing the loading capacity of each infiltration installation and increasing the cost of fabricating parts. Producing parts that are frustoconical in shape and of large dimensions on an industrial scale thus requires a large number of infiltration installations to be built and used, which is highly penalizing in economic terms.

OBJECT AND SUMMARY OF THE INVENTION

Consequently, an object of the invention is to provide a loading solution that enables porous preforms of frustoconical shape, and in particular preforms of large dimensions and small thickness, to be densified with large loading capacity, and to do so while minimizing densification gradients within the substrates.

This object is achieved by a loader device comprising:
a support tray;
a first stack comprising a plurality of bottom rings arranged on the support tray, each bottom ring having a plurality of injection orifices extending between the outer periphery and the inner periphery of each ring;
a second stack comprising a plurality of top rings, each top ring having a plurality of discharge orifices extending between the outer periphery and inner periphery of each ring;
a first non-porous wall of shape and dimensions identical to the shape and dimensions of the porous preforms for densifying, said first non-porous wall being arranged on the support tray inside the bottom rings of the first stack and extending between the support tray and the top ring situated at the base of the second stack; and
a second non-porous wall of shape and dimensions identical to the shape and dimensions of the porous preforms for densifying, said second non-porous wall extending between the bottom ring situated at the top of the first stack and the top ring situated at the top of the second stack.

Consequently, the loader device of the invention makes it possible to densify porous frustoconical preforms while increasing the quality and the uniformity of the parts that are obtained and also improving use of the loading volume of the reaction chamber.

Each bottom ring of the first stack forms a support for the base of a first frustoconical porous preform for densifying. By loading the porous preforms in this way in the loader device, it is possible to engage the preforms in optimum manner one in another, while leaving spaces between them for passing a flow of the reagent gas on either side of each preform.

In addition, since each of these spaces is fed with reagent gas in independent manner via a respective bottom ring, it is possible to deliver an equivalent quantity of reagent gas into each of these spaces and to obtain uniform densification of the preforms.

The loader device of the invention also makes it possible to load all of the preforms for densifying in a reaction chamber of a densification installation or oven in a single operation. The length of time the installation is not in use is thus reduced considerably and the productivity of the installation is improved significantly.

In a first aspect of the loader device of the invention, it further includes a mast arranged at the center of the support tray and supporting the second stack comprising top rings.

In a second aspect of the loader device of the invention, it further includes a cover placed on the top ring situated at the top of the second stack.

In a third aspect of the loader device of the invention, each bottom ring includes an annular portion that is to support a porous preform for densifying.

In a fourth aspect of the loader device of the invention, each bottom ring presents a height that is determined as a function of the space to be arranged between two adjacent porous preforms. It is thus possible to adjust the dimensions of the volume for gas flow on either side of the preforms.

In a fifth aspect of the loader device of the invention, the bottom rings and the top rings are separated from one another by respective graphite gaskets in order to enable the loader device to be disassembled easily after each densification cycle. The gasket is preferably a gasket made of expanded graphite, e.g. out of the materials sold under the trademarks Sigraflex® or Papyex®.

The present invention also provides an installation for densifying porous preforms of frustoconical shape by chemical vapor infiltration, the installation comprising a reaction chamber, a reagent gas admission pipe situated at a first end of the chamber and leading into a preheater zone, and a discharge pipe situated in the vicinity of a second end of the chamber opposite from the first end, the installation being characterized in that the chamber contains a plurality of porous preforms of frustoconical shape mounted in the loader device of the invention, the bottom end of each preform standing on a bottom ring of the first stack so that the porous preforms are engaged one in another, while leaving spaces between each of the preforms, said spaces forming respective volumes for passing a flow of reagent gas on either side of each preform, each volume being fed with reagent gas via the orifices of a bottom ring of the first stack.

As mentioned above, in addition to enabling porous preforms of frustoconical shape and large dimensions to be loaded in optimum manner in a reaction chamber of a densification installation, the densification installation in combination with the loader device of the invention serves to improve the infiltration of the preforms both in terms of the degree of densification and in terms of the uniformity of densification.

The forced flow of the reagent gas streams in the spaces arranged one either side the porous preforms leads to force convection of the reagent gas, thereby encouraging and accelerating infiltration of the preforms.

Furthermore, the bottom rings make it possible to introduce an equivalent flow rate of reagent gas into each of the volumes arranged on either side of the porous preforms while minimizing head loss between those volumes and the volume present outside the porous preforms. Consequently, the gas flow rate is similar in each of the volumes. Furthermore, the gas introduced into each of the volumes presents equivalent maturity states (concentrations of reagent elements) and depletion rates (decreases in concentrations of reagent elements) between the bases and the tops of the preforms, thus making it possible to obtain uniform densification for all of the porous preforms.

The forced flow of the streams of reagent gas in the volumes present around the porous preforms makes it possible to obtain flow speeds of the reagent gas around the porous preforms that are considerably higher than those observed using prior art methods such as, in particular, those described in U.S. Pat. No. 7,182,980 and U.S. Pat. No. 5,904,957. This makes it possible to minimize variations in reagent gas concentration between the bases and the tops of the preforms, and consequently to reduce densification gradients along the preforms in the height direction.

In a first aspect of the installation of the invention, it further includes a sealing ring extending between the support tray of the loader device and the inner wall of the reaction chamber. Such a sealing ring encourages the reagent gas streams to pass through the orifices in the bottom rings.

In a second aspect of the installation of the invention, the sealing ring includes an annular gasket carrier arranged on the support tray and a graphite gasket extending from the outer periphery of said annular gasket carrier, said gasket being in contact with the inner wall of the reaction chamber.

In a third aspect of the installation of the invention, the dimensions of the injection orifices of the bottom rings are defined as a function of the flow rate of reagent gas that is to feed each reagent gas flow volume.

In a fourth aspect of the installation of the invention, the porous preforms are preforms for aeroengine after-burner parts.

BRIEF DESCRIPTION OF THE DRAWINGS

Other characteristics and advantages of the invention appear from the following description of particular embodiments of the invention given as non-limiting examples and with reference to the accompanying drawings, in which.

DETAILED DESCRIPTION OF AN EMBODIMENT

The present invention applies to densifying porous preforms that are of stackable shape, such as a frustoconical shape, but also of shapes that are not bodies of revolution, such as pyramid shapes or other shapes.

Figure 1A:
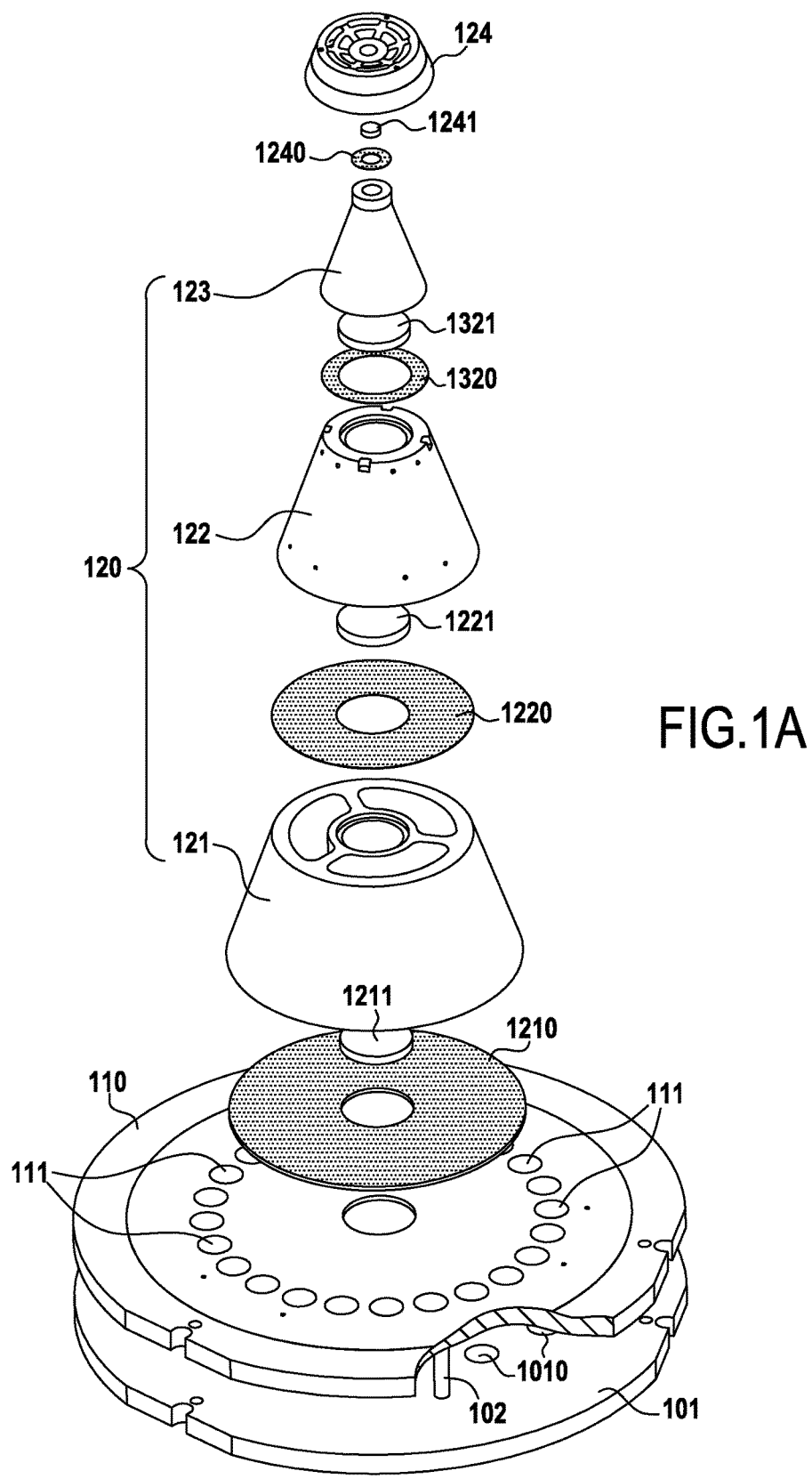
FIGS. 1A to 1N are diagrammatic views showing how a loader device in an embodiment of the invention is assembled and loaded.
Figure 1B:
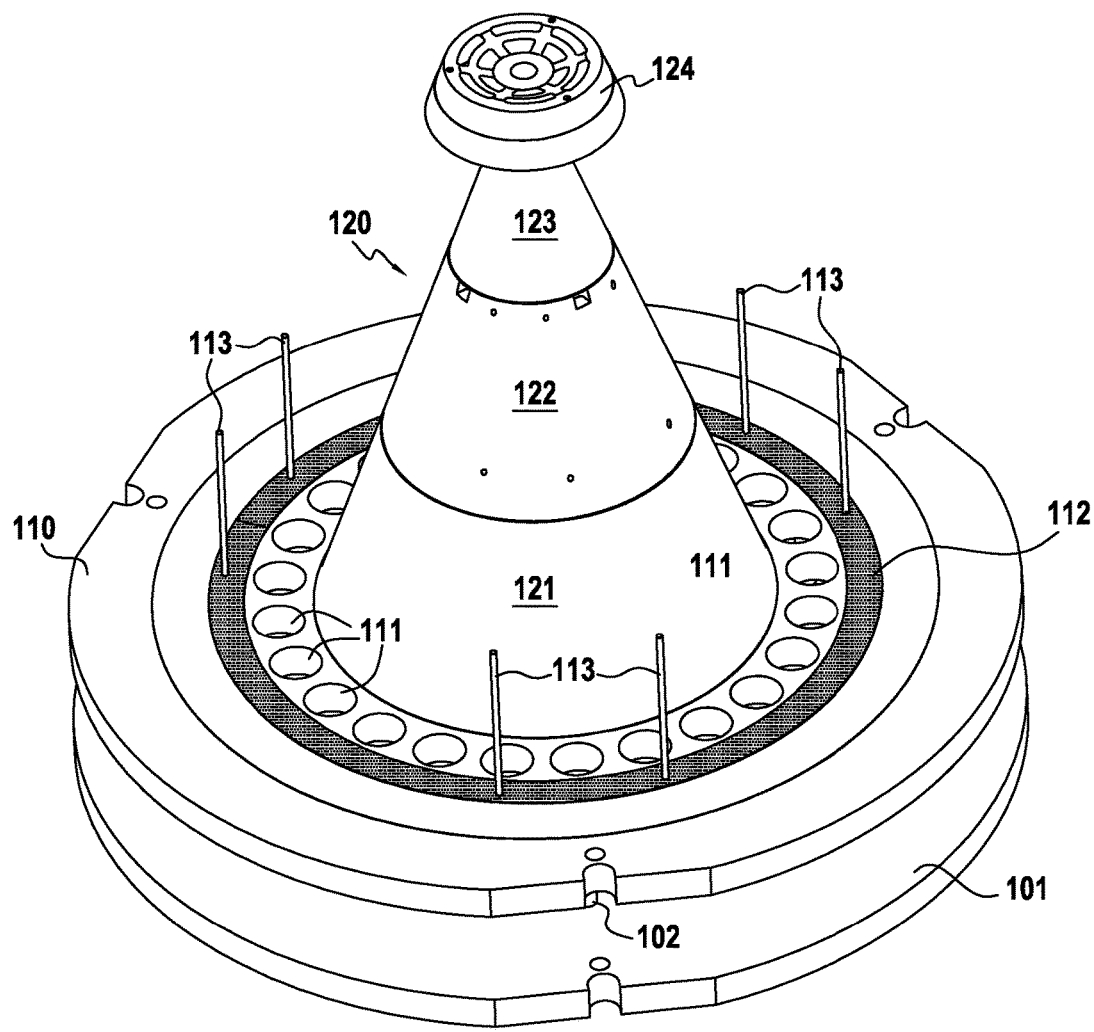
Figure 1C:
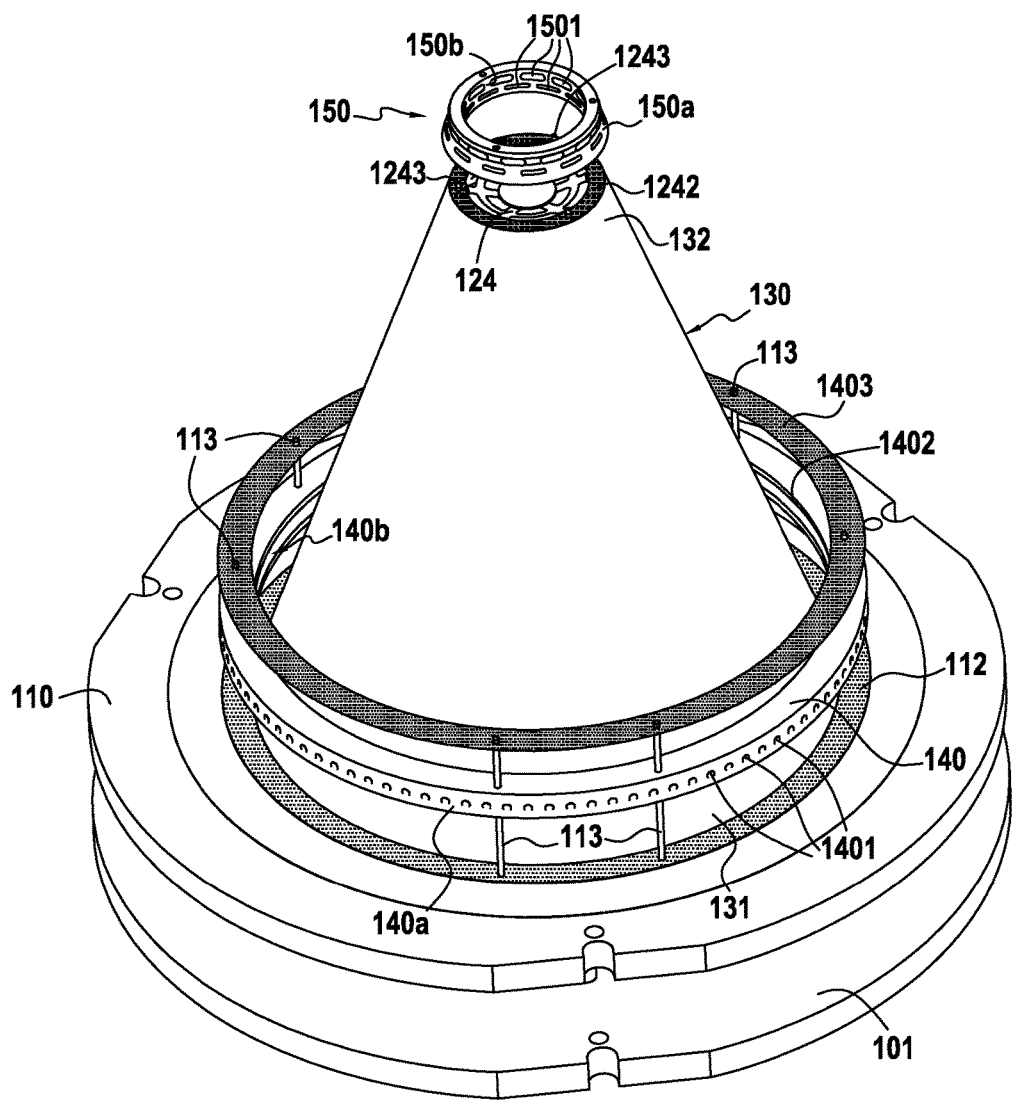
Figure 1D:
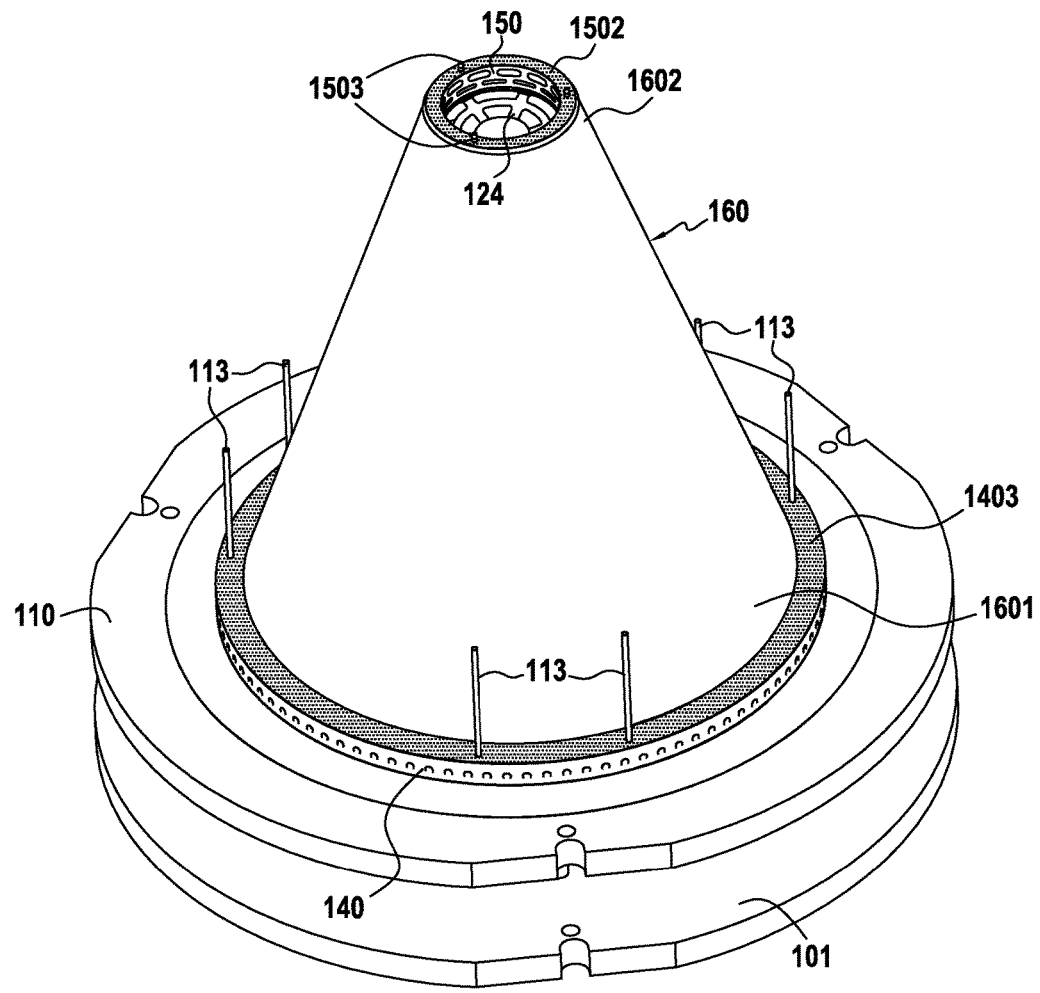
Figure 1E:
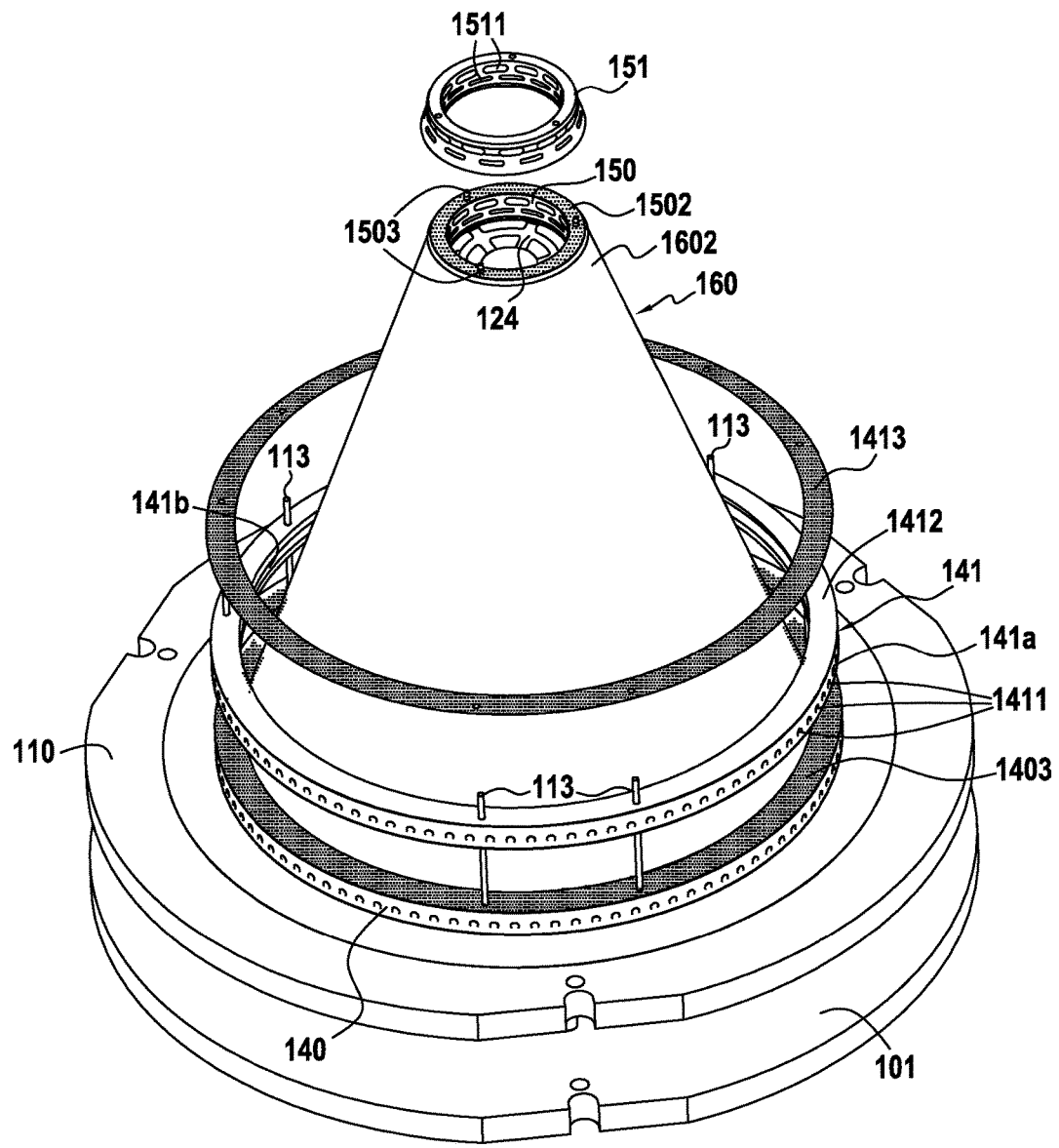
Figure 1F:
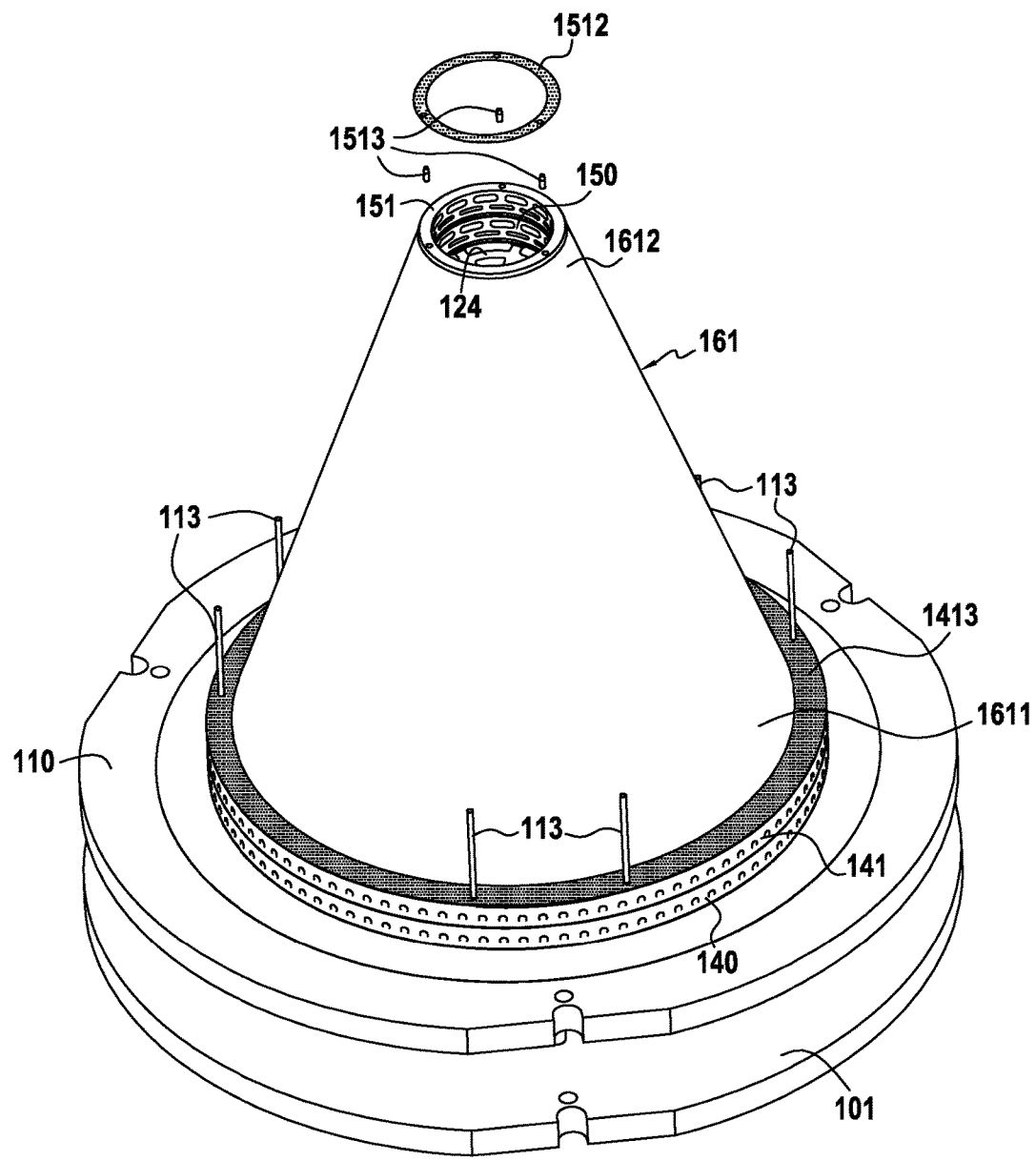
Figure 1G:
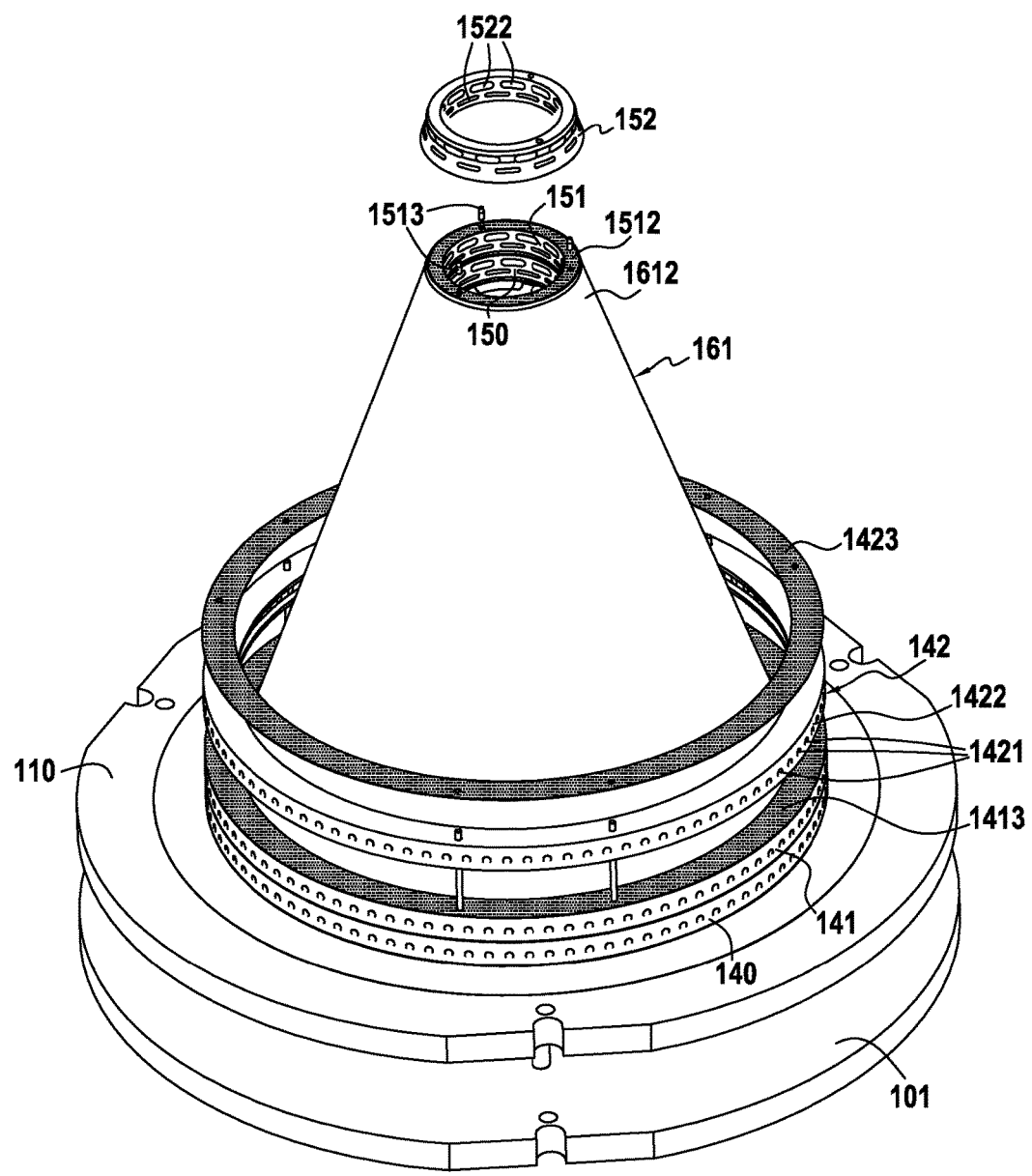
Figure 1H:
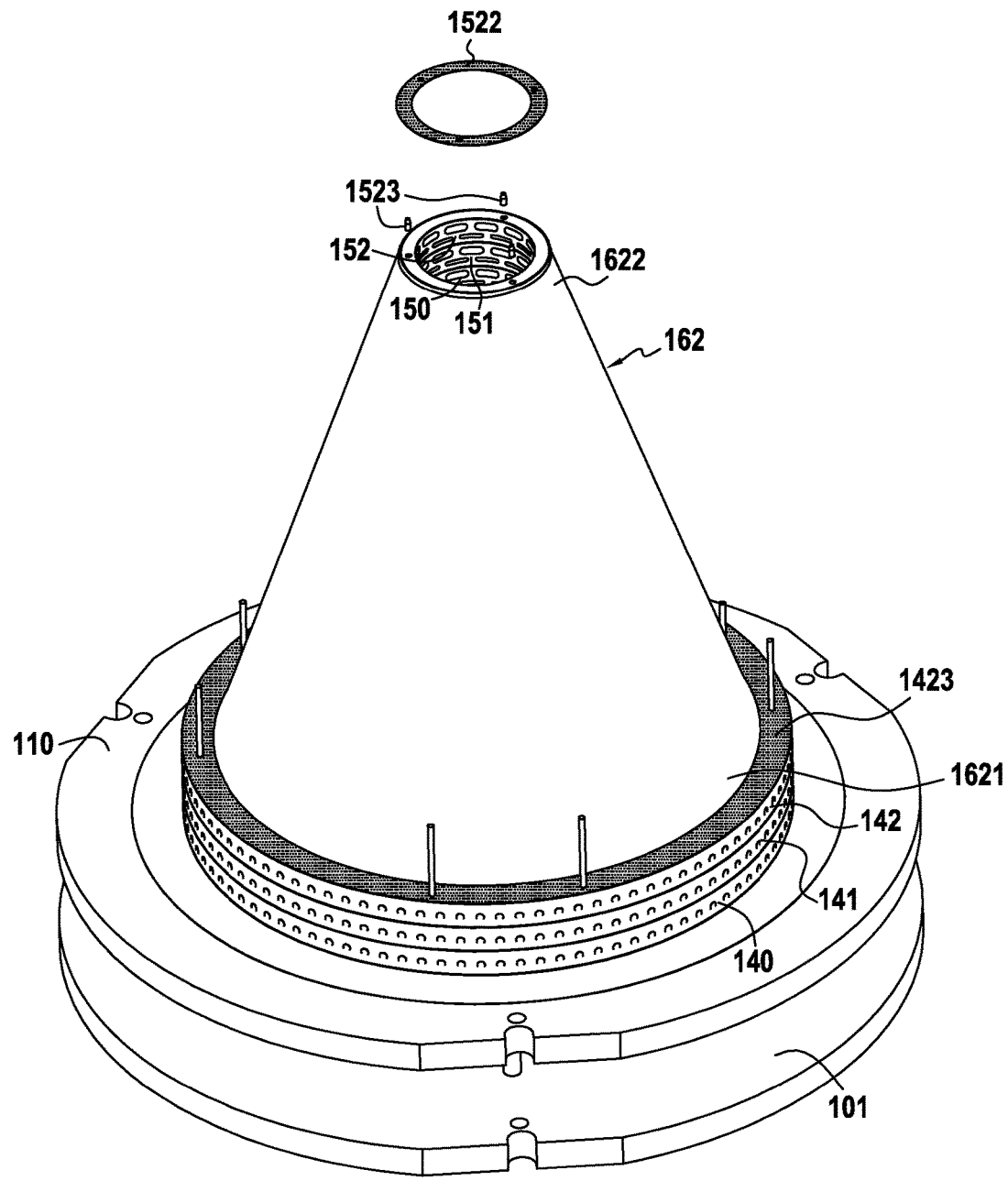
Figure 1I:
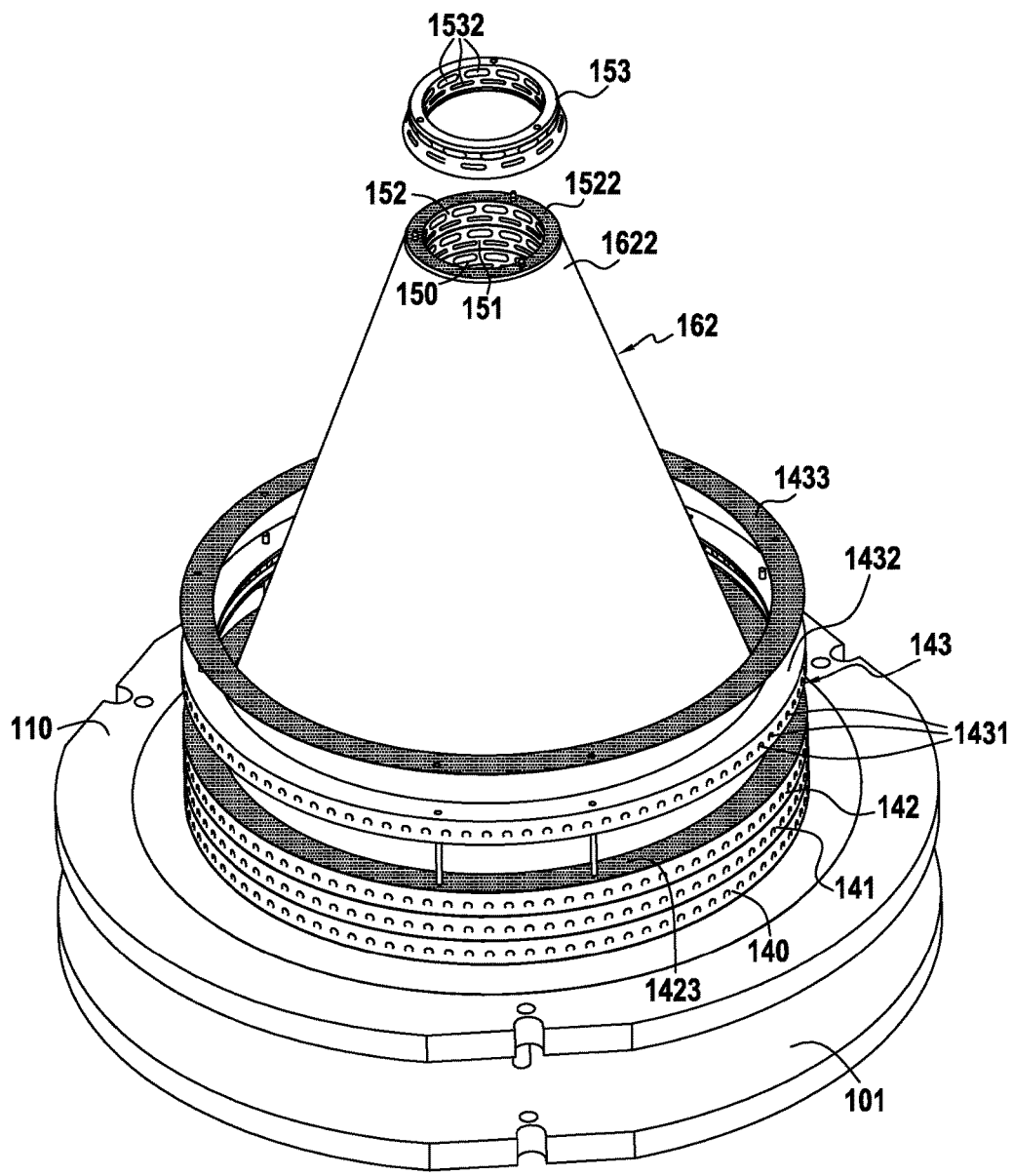
Figure 1J:
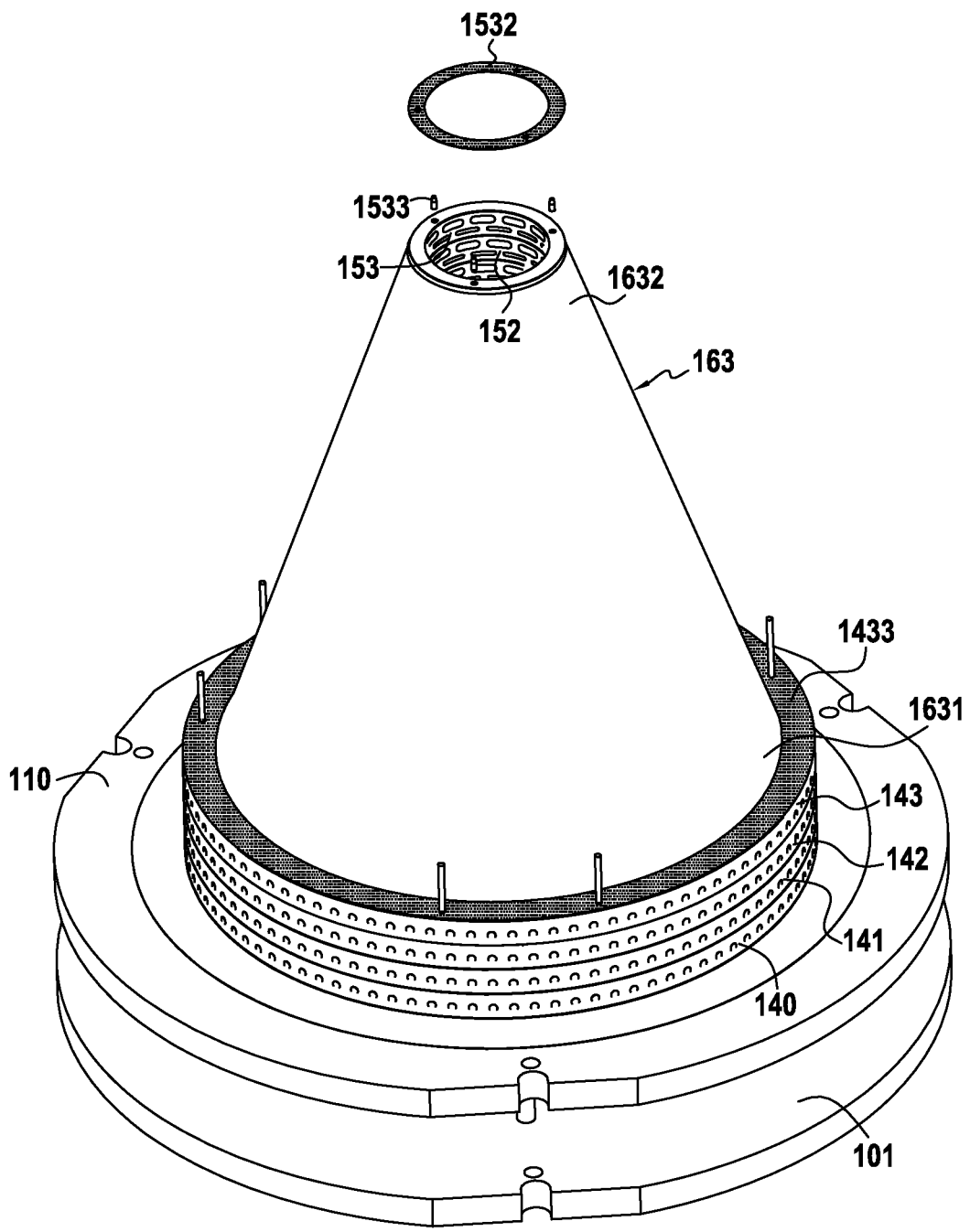
Figure 1K:
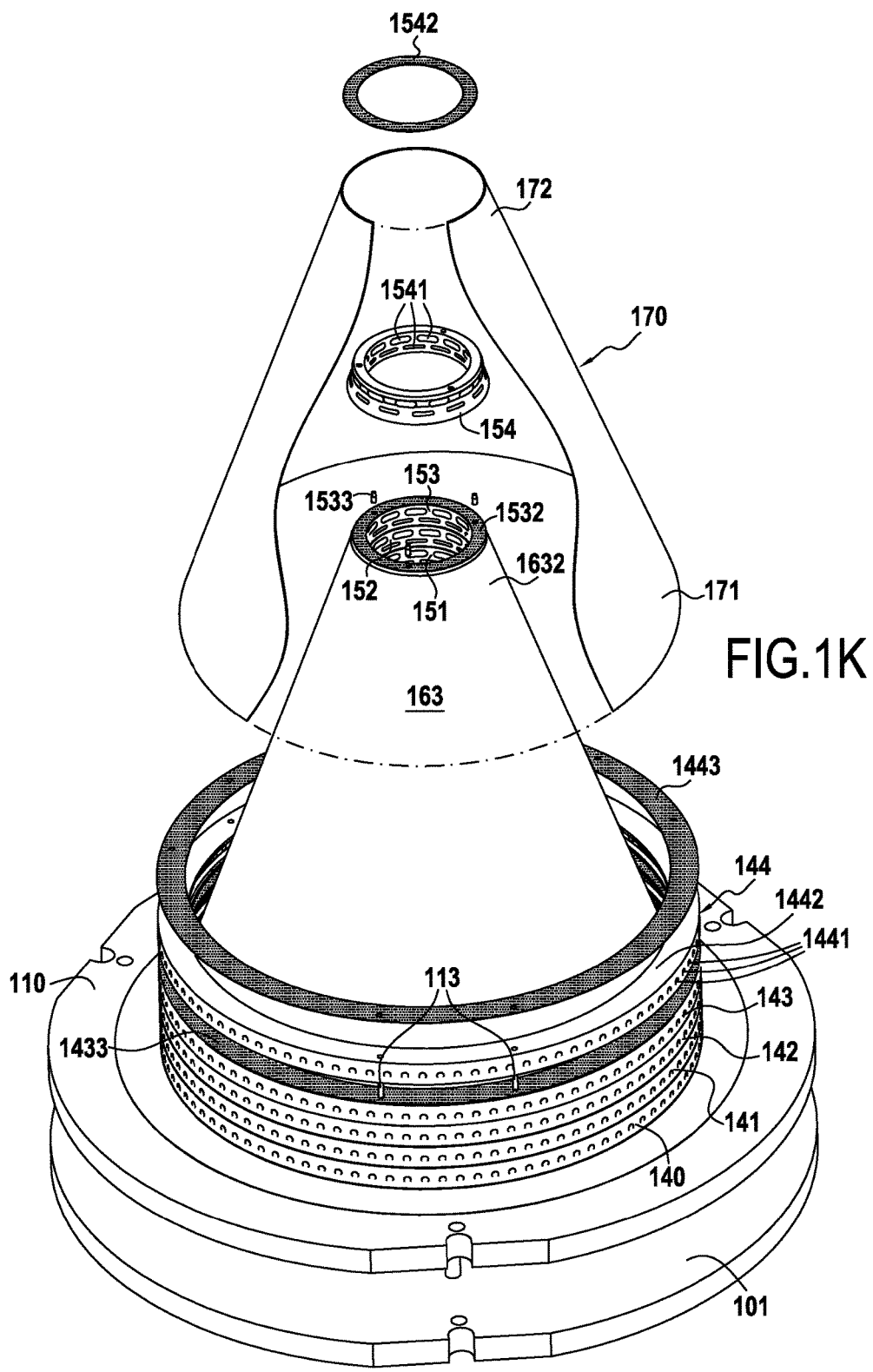
Figure 1L:
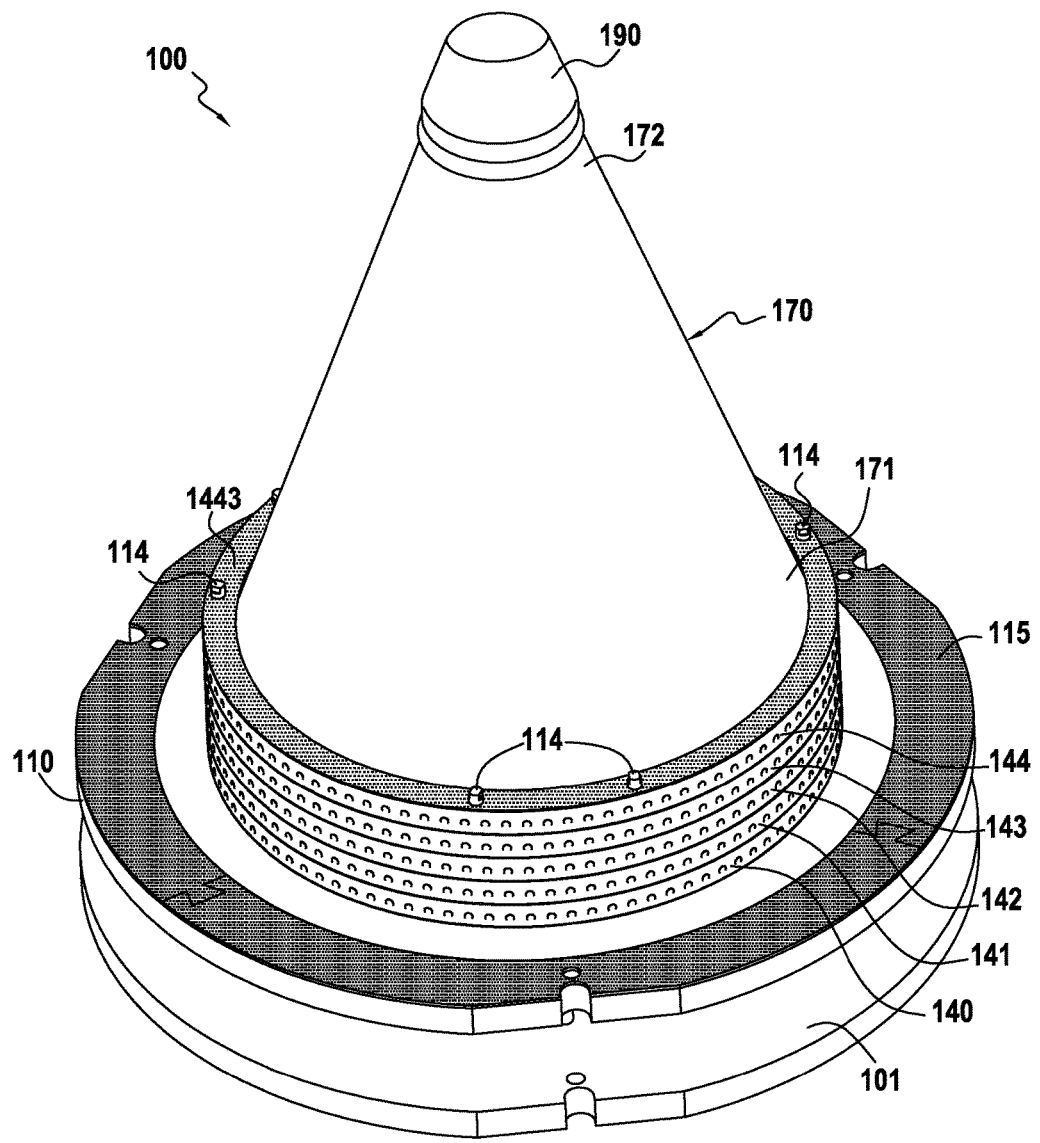
Figure 1M:
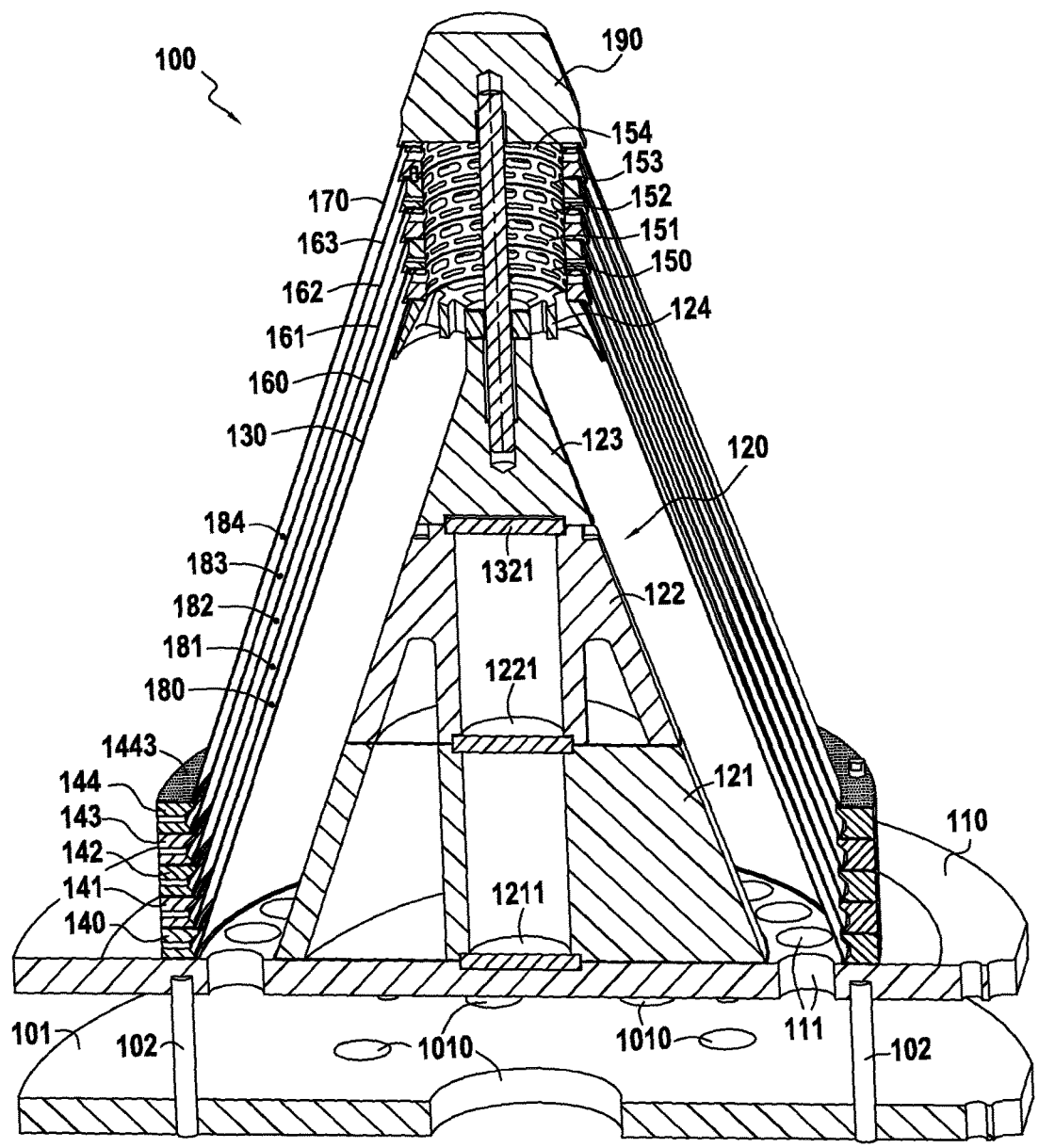

FIG. 1M shows a loader device or tooling 100 that, once loaded with porous preforms 160 to 163 for densifying, is to be inserted in a reaction chamber of an industrial chemical vapor infiltration installation. In the presently-described example, the loader device is for receiving fiber preforms of conical shape suitable in particular for constituting the diverging portions of rocket engines or all or some aeroengine after-body parts such as exhaust cones (also known as "plug nozzles").

Figure 1N:
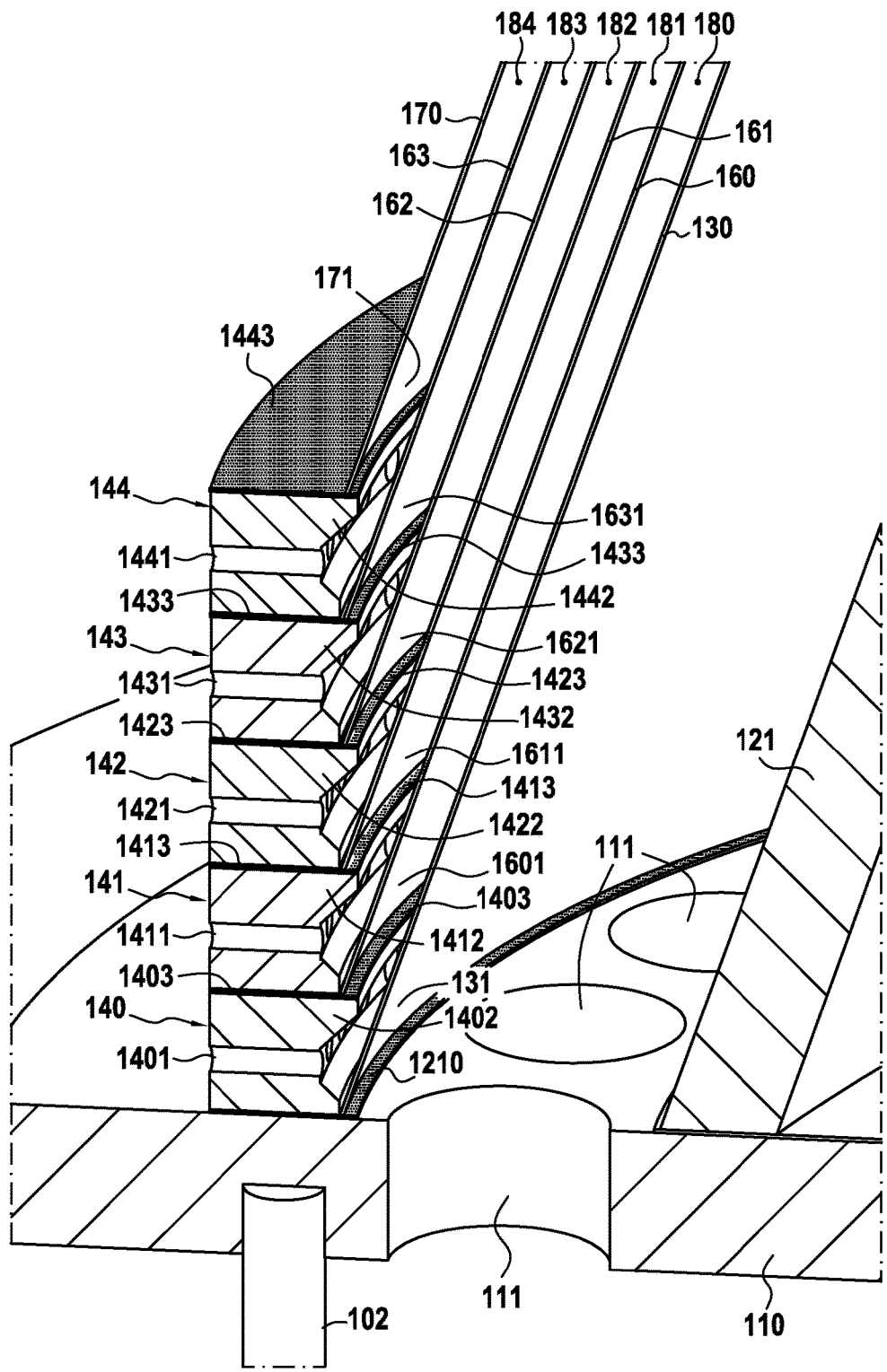

With reference to FIGS. 1A to 1N, there follows a description of how a loader device is assembled and how porous preforms are loaded therein in accordance with an embodiment of the invention.

As shown in FIG. 1A, the loader device is assembled from a circular support tray 110 having a plurality of discharge orifices 111 arranged in an annulus through the support tray 110. In the presently-described example, the support tray 110 is also mounted on a stand 101 by spacers 102, the stand 101 including discharge orifices 1010.

A mast 120, of conical shape in this example, is placed on the support tray 110. In the presently-described example, the mast 120 is made up of three frustoconical elements stacked one on another, namely a base 121 placed on the central portion of the support tray 110 with an interposed graphite gasket 1210 and a centering peg 1211, an intermediate portion 122 placed on the base 121 with an interposed graphite gasket 1220 and a centering peg 1221, and a top 123 placed on the intermediate portion 122 with an interposed graphite gasket 1230 and a centering peg 1231. The top 123 is covered by a graphite gasket 1240 and a centering peg 1241 and then capped by a centering ring 124 for positioning a non-porous inner wall, as described below.

An annular graphite gasket 112 and threaded rods 113 are positioned on the support tray 110 around the discharge orifices 111 (FIG. 1B).

A non-porous inner wall 130 is then positioned on the support tray 110 as shown in FIG. 1C. More precisely, the base 131 of the non-porous inner wall 130 stands on the support tray 110 via the gasket 112, while the top 132 of the wall 130 co-operates with the centering ring 124 present on the top 123 of the mast 120. The wall 130 is of shape and dimensions identical to the shape and dimensions of the porous preforms that are to be stacked on the device, as described below.

When the non-porous wall 130 is mechanically strong enough to support a stack of top rings and an optional cover as described below, the loader device need not have a central mast such as the above-described mast 120. Under such circumstances, the use of a centering ring such as the ring 124 is not necessary.

FIG. 1C also shows a first bottom ring 140 being put into place on the support tray 110 on the annular graphite gasket 112, the ring 140 surrounding the base 131 of the non-porous wall. The bottom ring 140 has a plurality of orifices 1401 extending between the outer periphery 140a and the inner periphery 140b of the ring 140. The bottom ring 140 also has an annular portion 1402 on its inner periphery for the purpose of supporting the base of a porous preform. An annular graphite gasket 1403 is placed on the top portion of the ring 140.

A first top ring 150 is arranged on the centering ring 124 at the top 123 of the mast 120 with an interposed graphite gasket 1242 and centering pegs 1243. The top ring 150 has a plurality of orifices 1501 extending between its outer periphery 150a and its inner periphery 150b.

FIG. 1D shows the positioning of a first porous preform 160 with its base 1601 standing on the annular portion 1402 of the first bottom ring 140 that is covered by the gasket 1403 (FIG. 1N), the top 1602 of the first preform 160 co-operating with the first top ring 150, an annular graphite gasket 1502 and centering pegs 1503 being positioned on the top portion of the ring 150 and on the top 1602 of the first porous preform 160.

In FIG. 1E, a second bottom ring 141 identical to the first bottom ring 140, i.e. presenting dimensions that are similar and including a plurality of orifices 1411 and an annular portion 1412 for supporting the base of a second porous preform, is placed on the first bottom ring 140 with the annular graphite gasket 1403 interposed between them. Another annular graphite gasket 1413 is placed on the top portion of the ring 141. A second top ring 151 likewise identical to the first top ring 150 in that it presents the same dimensions and also has a plurality of orifices 1511, is positioned on the first top ring 150 with the annular graphite gasket 1502 interposed between them.

In FIG. 1F, a second porous preform 161 is then engaged on the first preform 160. The base 1611 of the second preform 161 stands on the annular portion 1412 of the second bottom ring 141, which is covered by a gasket 1413 (FIG. 1N), while the top 1612 of the second preform 161 co-operates with the second top ring 151. An annular graphite gasket 1512 and centering pegs 1513 are positioned on the top portion of the ring 151.

In FIG. 1G, a third bottom ring 142 identical to the bottom rings 140 and 141, i.e. presenting dimensions that are similar and including a plurality of orifices 1421 and an annular portion 1422 for supporting the base of a third porous preform, is put into place on the second bottom ring 141 with the annular graphite gasket 1413 interposed between them. Another annular graphite gasket 1423 is placed on the top portion of the ring 142. A third top ring 152 likewise identical to the top rings 150 and 151 in that it presents the same dimensions and also has a plurality of orifices 1521, is placed on the second top ring 151 with the annular graphite gasket 1512 interposed between them.

In FIG. 1H, a third porous preform 162 is then engaged on the second preform 261. The base 1621 of the third porous preform 162 stands on the annular portion 1422 of the third bottom ring 142 covered by the gasket 1423 (FIG. 1N), while the top 1622 of the third preform 162 co-operates with the third top ring 152. An annular graphite gasket 1522 and centering pegs 1523 are positioned on the top portion of the ring 152.

In FIG. 1I, a fourth bottom ring 143 identical to the bottom rings 140 to 142, i.e. presenting dimensions that are similar and including a plurality of orifices 1431 and an annular portion 1432 for supporting the base of the fourth porous preform, is put into place on the third bottom ring 142 with the annular graphite gasket 1423 interposed between them. Another annular graphite gasket 1433 is placed on the top portion of the ring 143. A fourth top ring 153 likewise identical to the top rings 150 to 152 in that it presents the same dimensions and also has a plurality of orifices 1531, is positioned on the third top ring 152 with the annular graphite gasket 1522 interposed between them.

In FIG. 1J, a fourth porous preform 163 is then engaged on the third preform 163. The base 1631 of the fourth porous preform 163 stands on the annular portion 1432 of the fourth bottom ring 143 covered by the gasket 1433 (FIG. 1N), while the top 1632 of the fourth preform 163 co-operates with the fourth top ring 153. An annular graphite gasket 1532 and centering pegs 1533 are positioned on the top portion of the ring 153.

Once the fourth fiber preform 163 has been positioned on the annular portion 1432 of the fourth bottom ring 143 that is covered in the gasket 1433 (FIG. 1N), a fifth bottom ring 144 and a fifth top ring 154 are placed respectively on the fourth bottom ring 144 and on the fourth top ring 154 with annular graphite gaskets 1433 and 1532 being interposed, as shown in FIG. 1K. The fifth bottom ring 144 presents respectively the same dimensions as the bottom rings 140 to 143 and like them it includes a plurality of orifices 1441 and an annular portion 1442. The fifth top ring 154 has the same dimensions as the top rings 150 to 153 and like them it includes a plurality of orifices 1541.

As shown in FIGS. 1K and 1L, the stack of porous preforms 160 to 163 is then closed by positioning a non-porous outer wall 170 having shape and dimensions identical to the shape and dimensions of the porous preforms. The base 171 of the non-porous outer wall 170 stands on the annular portion 1442 of the fifth bottom ring 144 covered by the gasket 1443 (FIG. 1N), while the top 172 of the wall 170 co-operates with the top portion of the fifth top ring 154. A cover or plug 190 is also fastened via a graphite gasket 1542 on the top portion of the fifth top ring 154 in order to close the top of the stack at the top 172 of the wall 170. The top of the stack of top rings may also be closed by the last ring in the stack being a ring that is closed in its top portion, the use of a cover or plug then no longer being necessary.

The stack of bottom rings 140 to 144 is secured to the support tray 110 by tightening nuts 114 on the threaded rods 113. An annular graphite gasket 115 is arranged on the support tray in the proximity of its outer periphery.

As shown in FIG. 1M, the respective spaces present between the non-porous wall 130, the porous preforms 160, 161, 162, and 163, and the non-porous wall 170 form respective volumes 180 to 184 extending all around each porous preform and within which streams of reagent gas flow for the purpose of densifying the porous preforms 160 to 163. The distance between two adjacent fiber preforms or between a non-porous wall and the adjacent preform is relatively small, e.g. 10 millimeters (mm), such that in each of the volumes 180 to 184, the reagent gas flows very close to the porous preforms for densifying.

Figure 2:
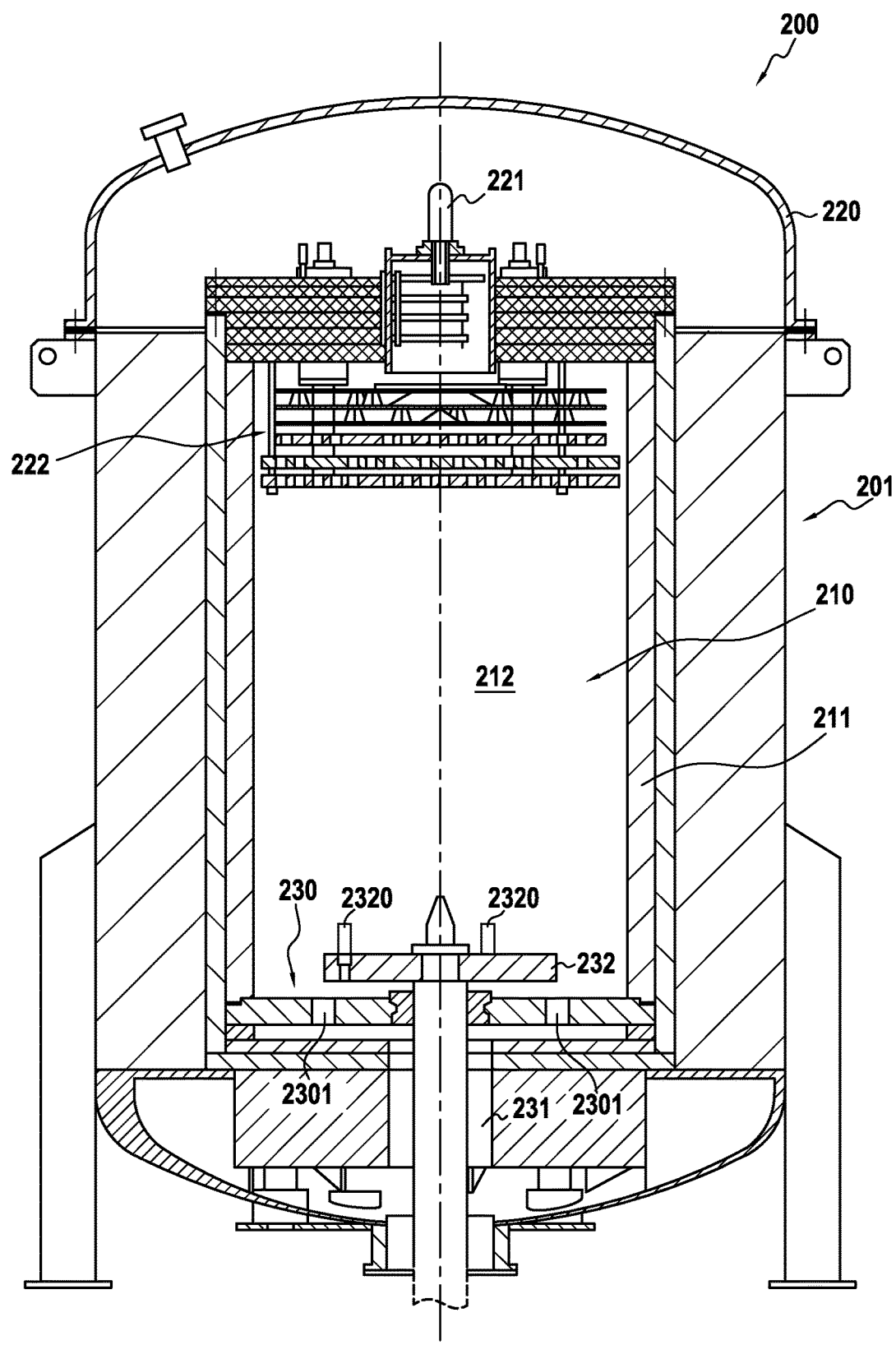
FIG. 2 is a section view of an installation for densification by chemical vapor infiltration.

FIG. 2 is a diagram of a chemical vapor infiltration oven or installation 200 that is to receive the loader device 100 including the porous preforms for densifying. In known manner, the chemical vapor infiltration installation 200 comprises a cylindrical enclosure 201 defining a reaction chamber 210 closed in its top portion by a removable cover 220 having a gas admission pipe 221 that leads to a preheater zone 222 serving to heat the gas before it diffuses in the reaction chamber 210 containing the preforms for densifying. The residual gas is extracted from the bottom 230 of the installation via a discharge pipe 231 that is connected to suction means (not shown). The bottom 230 has a support 232 through which the discharge pipe 231 passes and on which the loader device 100 is to be placed via spacers 2320.

The heating in the preheater zone and inside the reaction chamber 210 is produced by a graphite susceptor 211 forming a secondary circuit that is electromagnetically coupled with an inductor (not shown). The space present in the reaction chamber 210 between the preheater zone 222 and the support 232 corresponds to the working loading volume 212 of the infiltration installation 200, i.e. to the volume that is available for being loaded with fiber preforms for densifying.

Figure 3A:
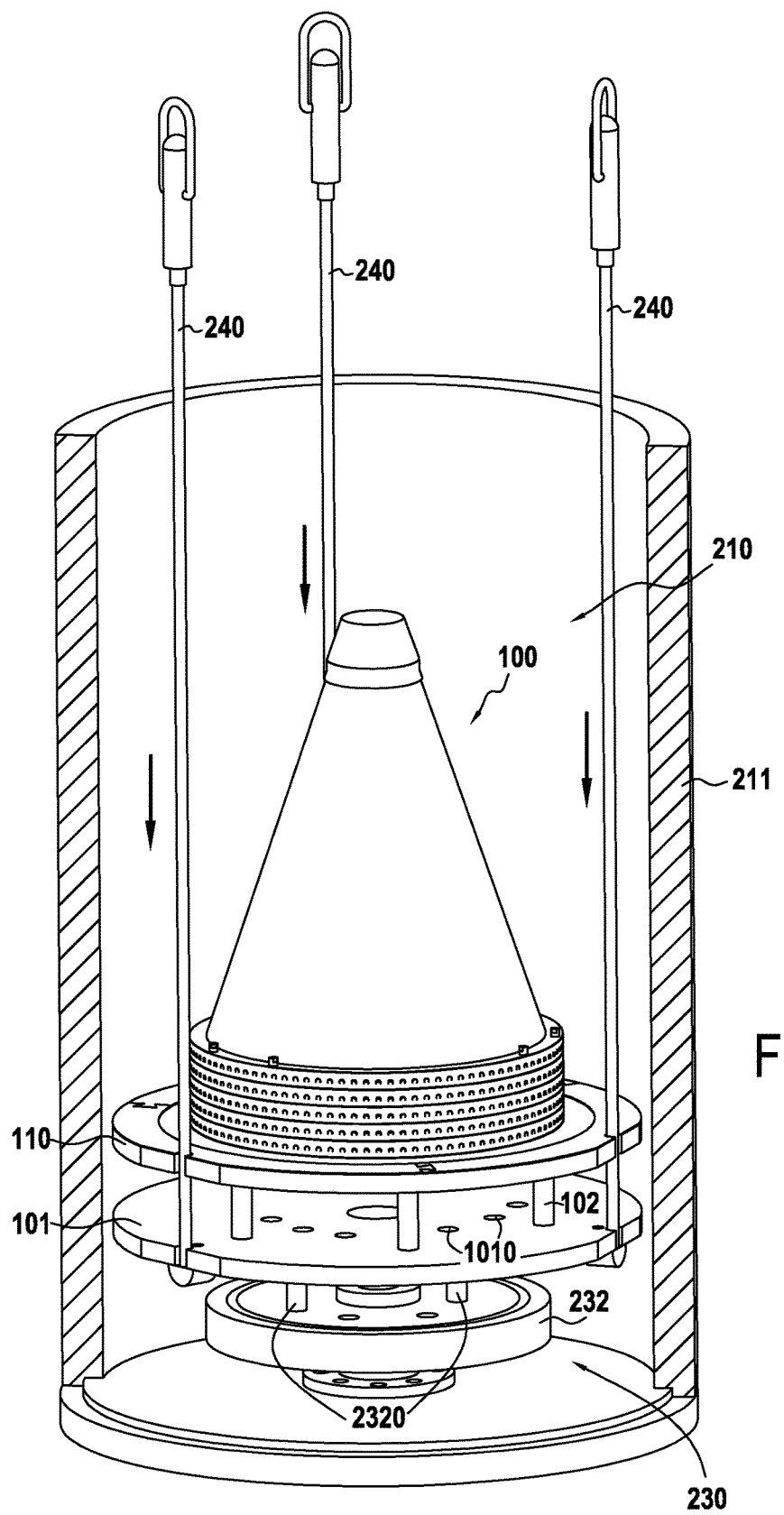
FIGS. 3A to 3C are section views showing the installation of a loader device and a sealing ring of the invention in the installation of FIG. 2.

There follows a description of how the loader device 100 carrying the porous preforms 160 to 163 for densifying in the chemical vapor infiltration installation 200 is put into place. As shown in FIG. 3A, the cover 220 of the installation 200 is removed so as to enable the loader device 100 to be loaded into the reaction chamber 210, the loader device 100 being lowered into the chamber 210, e.g. by means of hanger rods 240, until the stand 101 of the loader device is standing on the support 232 via the spacers 2320.

Figure 3B:
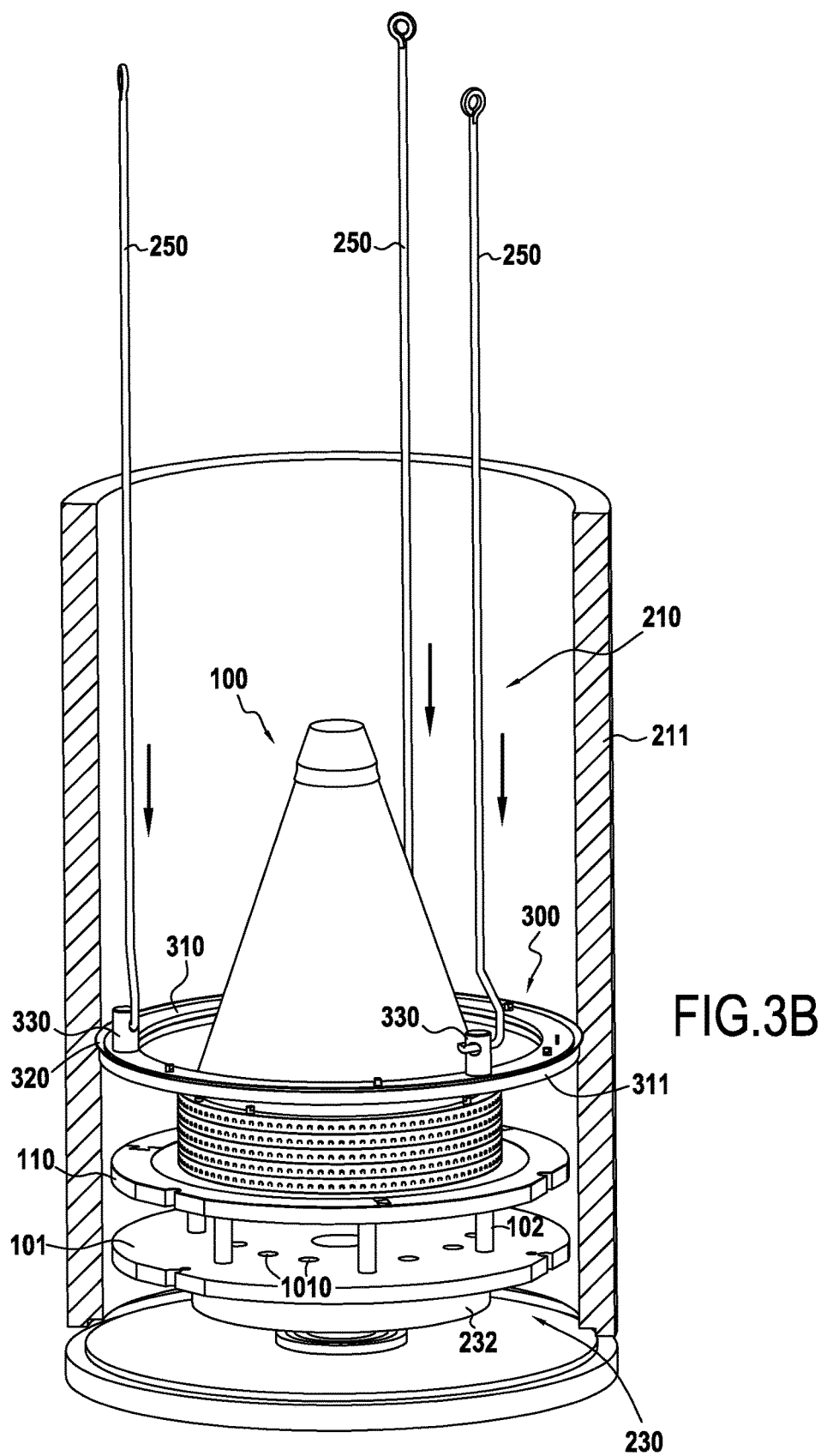

In accordance with the invention, a sealing ring 300 is also placed on the support tray 110 of the loader device 100, e.g. by means of hanger rods 250 co-operating with studs 330 fastened on the sealing ring 300 (FIG. 3B).

Figure 4:
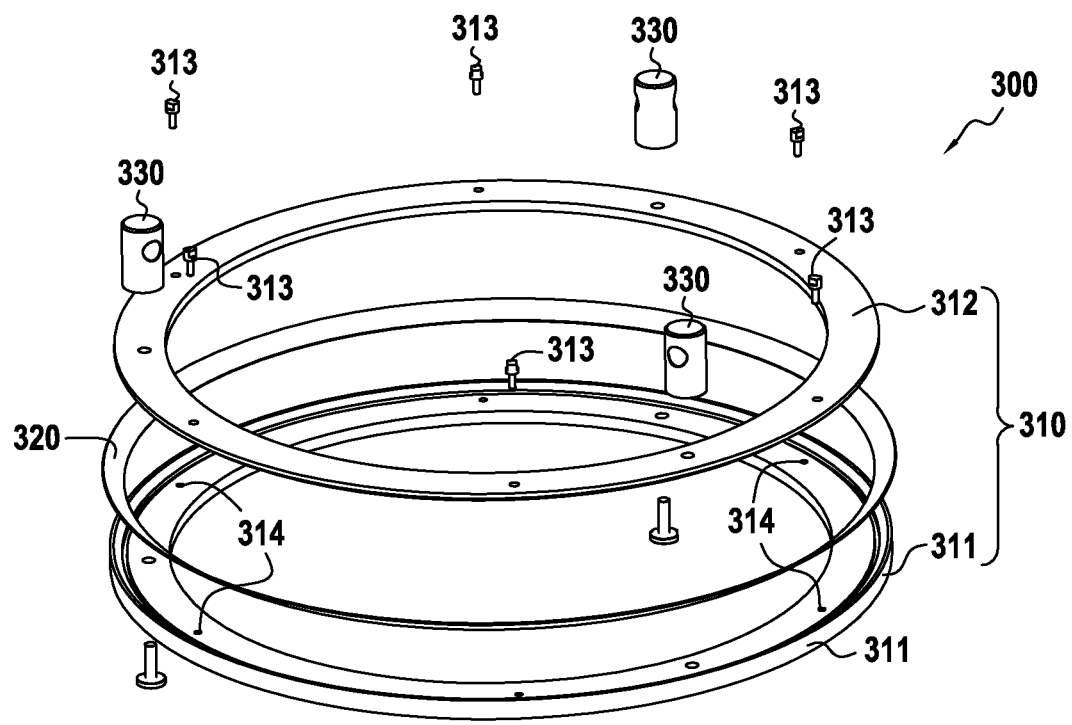
FIG. 4 is an exploded diagrammatic perspective view of a sealing ring in accordance with an embodiment of the invention.

As shown in FIG. 4, the sealing ring comprises an annular gasket carrier 310 made up of a bottom portion 311 and a top portion 312 together with an annular graphite gasket 320 clamped between the portions 311 and 312 of the gasket carrier 310 by tightening screws 313 in tapped holes 314 provided in the bottom portion 311 of the gasket carrier 310.

Figure 5:
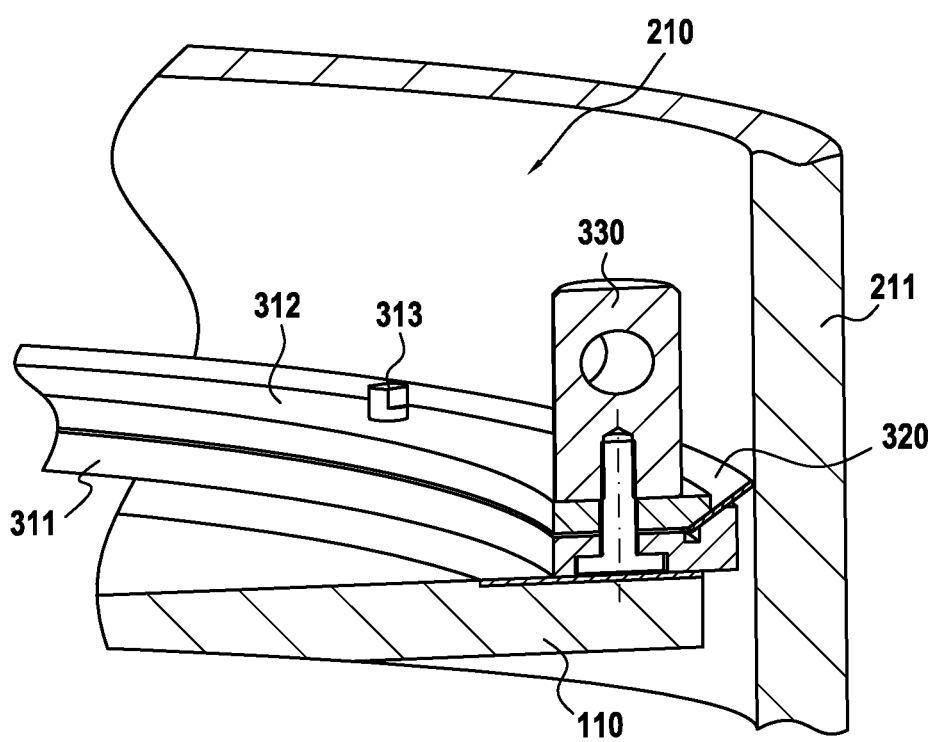
FIG. 5 is a detail view in perspective of the sealing ring shown in FIG. 3C.

As shown in FIG. 5, the graphite gasket 320 extends from the outer periphery of the gasket carrier 320 over a determined distance so as to come into contact with the inner wall of the susceptor 211 forming the inner wall of the reaction chamber 210.

As described below, the sealing ring 300 serves to force the streams of gas introduced into the reaction chamber to penetrate into the orifices in the bottom rings and to flow in the gas flow spaces defined between the porous preforms or between a non-porous wall and a porous preform.

Figure 3C:
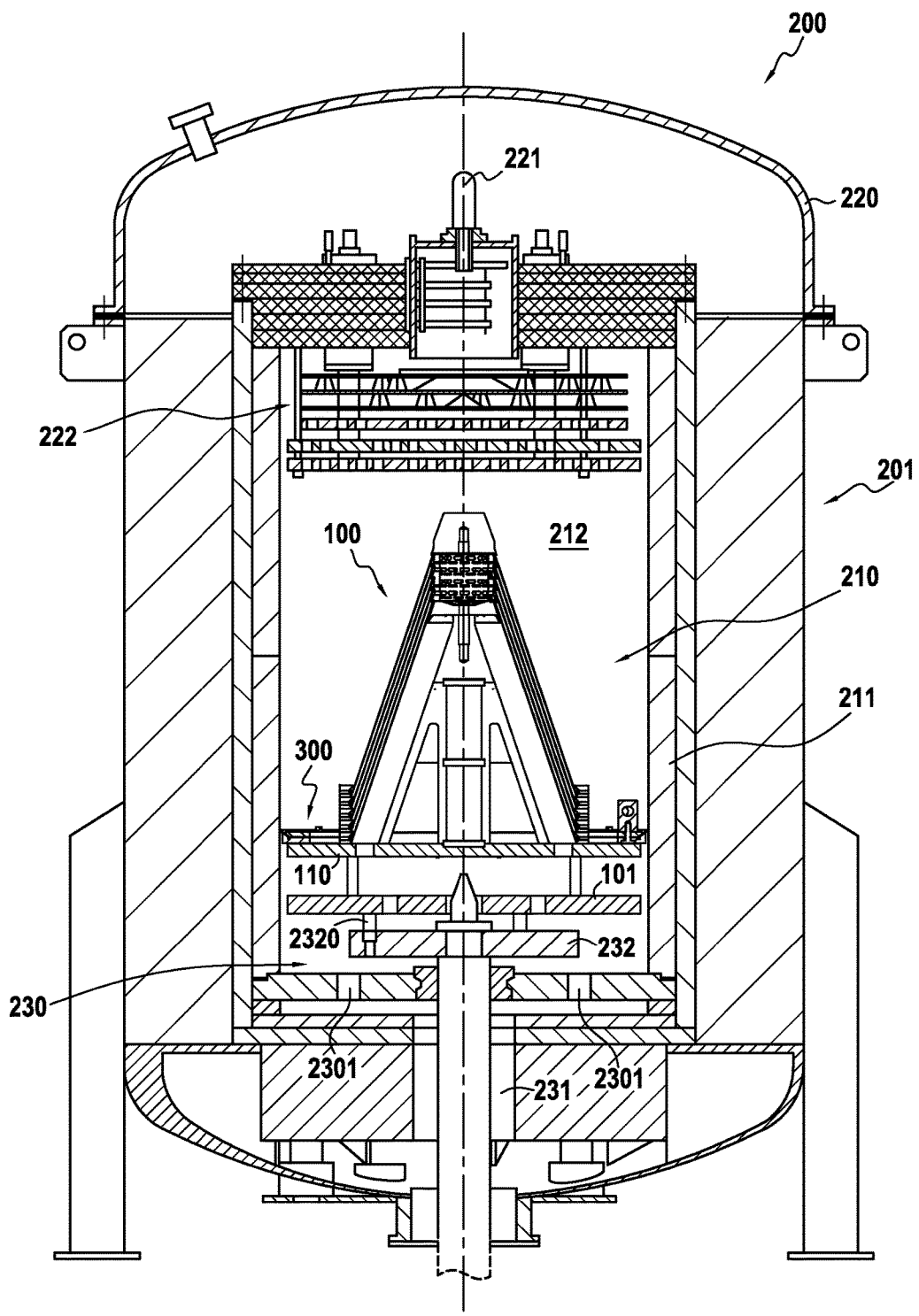

Once the loader device 100 and the sealing ring have been put into position in the reaction chamber 210, the cover 220 is mounted on the top portion of the enclosure 201 (FIG. 3C). The chemical vapor infiltration installation is then ready to operate.

In order to densify the preforms, a reagent gas containing at least one or more precursors of the material of the matrix that is to be deposited is introduced into the reaction chamber 210. By way of example, for a carbon matrix use is made of gaseous hydrocarbon compounds, typically propane, methane, or a mixture of both. For a matrix made of ceramic material, such as silicon carbide (SiC), for example, it is possible in well-known manner to use methyltrichlorosilane (MTS) as a precursor for SiC.

In well-known manner, the porous preforms are densified by depositing within them the matrix material as produced by decomposing the precursor(s) contained in the reagent gas diffusing inside the accessible internal pores of the substrates. The pressure and temperature conditions needed to obtain a variety of matrix deposits by chemical vapor infiltration are themselves well known.

Figure 6:
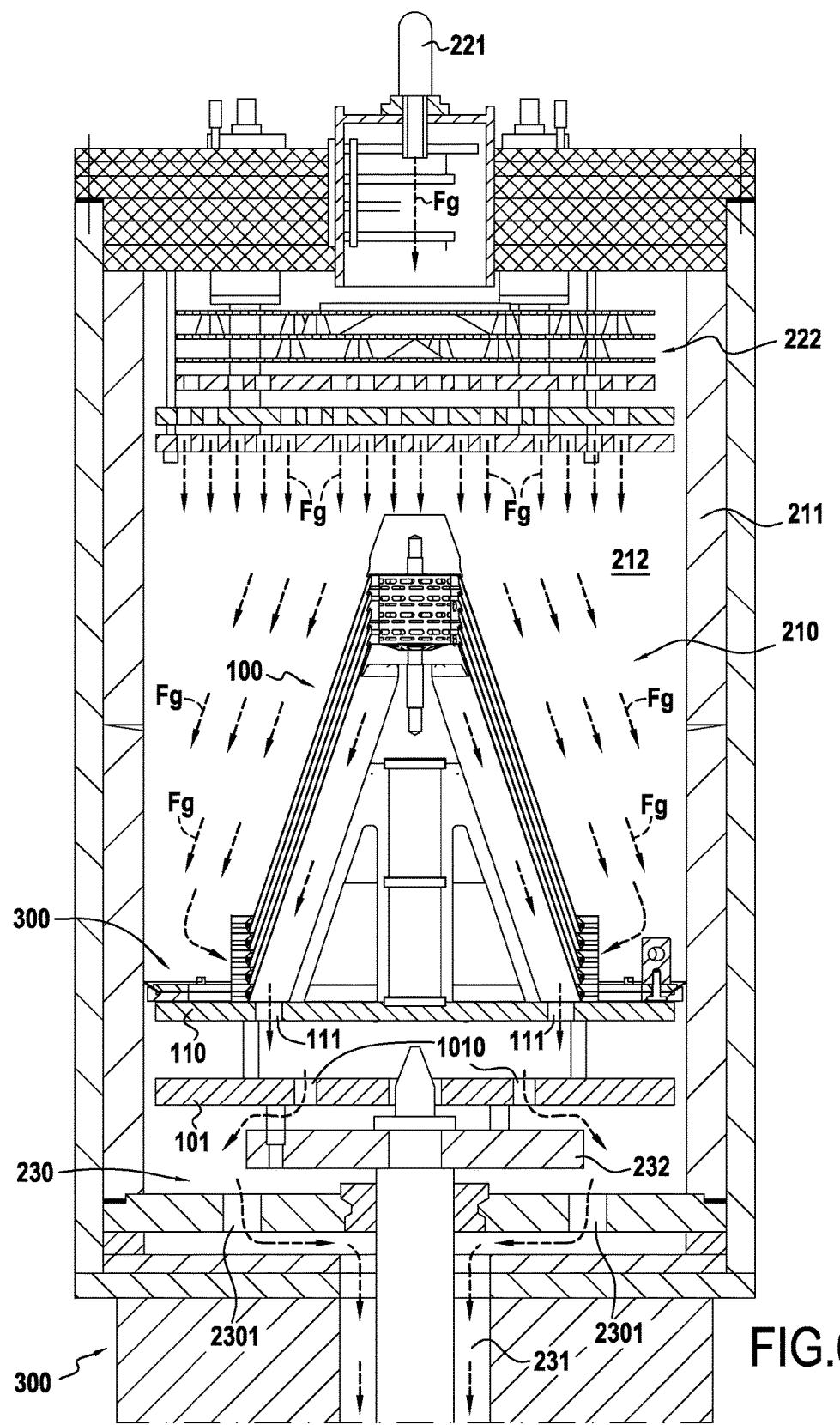
FIGS. 6 and 7 are fragmentary section views showing the path followed by reagent gas streams during densification of porous preforms while the FIG. 3C installation is in operation.
Figure 7:
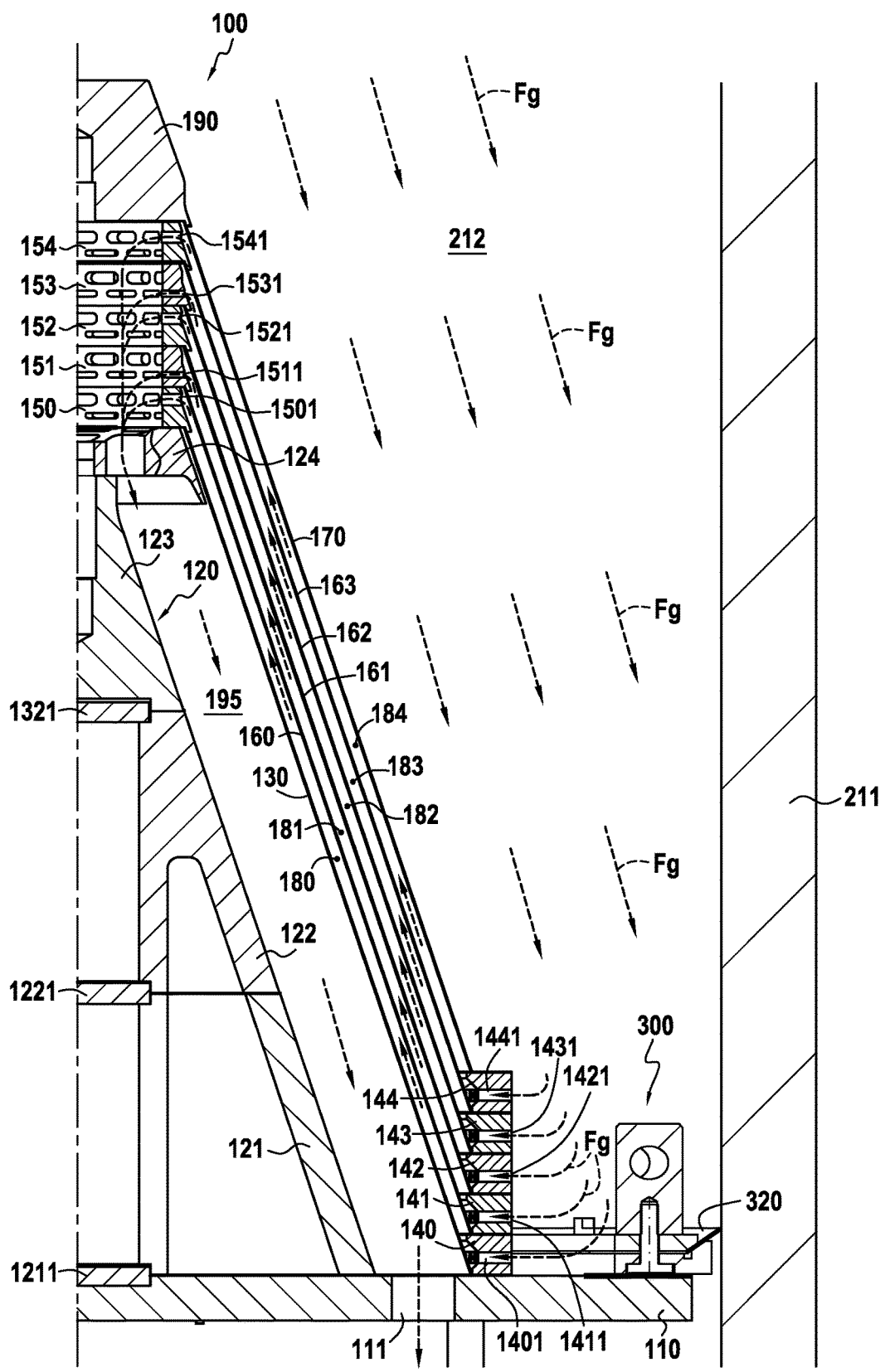

FIGS. 6 and 7 show the paths followed by the reagent gas streams Fg that are introduced into the reaction chamber 210 by the admission pipe 221. A pressure gradient is established between the feed pipe 221 and the discharge pipe 231 in order to encourage streams of reagent gas to pass through the orifices in the bottom rings and to flow in the volumes 180 to 184 present on either side of each of the porous preforms 160 to 163. The streams Fg begin by passing through the preheater zone 222 and then they spread out through the volume present around the loader device 100. The gas streams Fg cannot go beyond the sealing ring 300, so they penetrate into the orifices 1401, 1411, 1421, 1431, and 1441 in the bottom rings 140 to 144 (FIG. 7). Thereafter, the gas streams flow in the volumes 180 to 184 present on either side of the porous preforms 160 to 163 from the bases of the preforms up to the tops thereof, where the residues of the gas streams that have not reacted with the preforms are discharged via the orifices 1501, 1511, 1521, 1531, and 1541 in the top rings 150 to 154, and then flow in the volume 195 defined between the mast 120 and the non-porous wall 130 so as to be extracted from the reaction chamber 210 via the discharge pipe 231 (FIG. 6).

In addition to enabling preforms of frustoconical shape and of large dimensions to be loaded in optimum manner in the reaction chamber of a densification installation, the loader device of the invention serves to improve the infiltration of the preforms both in terms of their degree of densification and in terms of the uniformity of the densification.

The forced flow of reagent gas streams in the spaces provided on either side of the porous preforms gives rise to forced convection of the reagent gas, thereby encouraging and accelerating infiltration of the preforms.

Furthermore, the number and the diameter of the orifices for injecting reagent gas into the spaces provided on either side of the porous preforms, in this example the orifices 1401, 1411, 1421, 1431, and 1441 in the bottom rings 140 to 144, are identical for each bottom ring and also for each top ring so as to introduce equivalent flow rates of reagent gas into the volumes 180 to 184 provided on either side of the porous preforms. Consequently, the gas flow rates are similar in each of the volumes 180 to 184. In addition, the gas introduced into each of the volumes 180 to 184 presents equivalent maturity states (concentrations of reagent elements) and depletion rates (decreases in concentrations of reagent elements) between the bases and the tops of the preforms, thereby making it possible to obtain densification that is uniform in all of the porous preforms. Furthermore, the diameter of the reagent gas injection orifices in the bottom rings is selected so as to minimize head loss between these volumes and the volume present outside the porous preforms.

Another advantage of the loader device of the invention is to be able to preheat the reagent gas in a standard preheater zone of a prior art densification installation using flow rates and transit times in said zone that are identical to those usually encountered in prior art densification methods. Thus, the gas presents maturity similar to that obtained in prior art densification methods, thereby making it possible to use the same densification parameters (in particular temperature, pressure, and concentration of the gas).

Nevertheless, the forced flow of reagent gas streams in the narrow volumes 180 to 184 that are present around the porous preforms 160 to 163 makes it possible to obtain reagent gas travel speeds around the porous preforms that are much higher than those observed with prior art methods such as those described in particular in U.S. Pat. Nos. 7,182,980 and 5,904,957. That makes it possible to minimize variations in the concentration of reagent gas between the bases and the tops of the preforms, and consequently to reduce densification gradients in the height direction of the preforms. When densifying a plurality of stacked porous preforms of conical shape, as described above, the reagent gas is preferably introduced into the gas flow volumes provided around the preforms, such as the above-described volumes 180 to 184, via the bases of the preforms. In this way, the gas streams having the greater concentrations of reagent elements are distributed over a greater densification area, thereby avoiding the surface pores in the preforms becoming clogged too quickly, which would prevent proper infiltration into the cores of the preforms.

The above-descried graphite gaskets are preferably made of expanded graphite such as the materials sold under the trademarks Sigraflex® or Papyex®.

In the above-described embodiment, the preforms for densifying present shapes that are frustoconical, such that the bottom and top rings present circular shapes that are appropriate for supporting and surrounding respectively the bases and the tops of the preforms and of the non-porous walls.

In addition, in the above-described example, the loader device has four preforms. Nevertheless, the loader device could have a larger number of preforms, which number is determined as a function of the working volume of the infiltration installation.

When the porous preforms for densifying are of different shapes, e.g. being of pyramid shape or oval, then the shapes of the top and bottom rings need to be adapted so as to match the shape of the preforms. For example, when the preforms for densifying are in the shape of a truncated pyramid with a square base, the top and bottom rings are square in shape and of dimensions that match respectively the dimensions of the bases and of the tops of the preforms.

Furthermore, in the above-described example, the reagent gas is introduced form the top of the reaction chamber and is discharged from its bottom. Nevertheless, the reagent gas could equally well be introduced via the bottom of the chamber and discharged from its top portion, e.g. via the cover. Under such circumstances, the loader device may for example be arranged upside-down in the reaction chamber so as to allow the gas to be introduced via the bottom rings and discharged via the top rings.

The invention claimed is:

1. A loader device for densifying porous preforms of frustoconical shape by means of directed stream chemical vapor infiltration in a reaction chamber of an infiltration oven, the device comprising:
    a support tray;
    a first stack comprising a plurality of bottom rings arranged on the support tray, each bottom ring having a plurality of injection orifices extending between the outer periphery and the inner periphery of each ring;
    a second stack comprising a plurality of top rings, each top ring having a plurality of discharge orifices extending between the outer periphery and inner periphery of each ring, the bottom rings having an inner diameter that is greater than an outer diameter of the top rings;
    a first non-porous wall of shape and dimensions identical to the shape and dimensions of the porous preforms for densifying, said first non-porous wall being arranged on the support tray inside the bottom rings of the first stack and extending between the support tray and the top ring situated at the base of the second stack; and
    a second non-porous wall of shape and dimensions identical to the shape and dimensions of the porous preforms for densifying, said second non-porous wall extending between the bottom ring situated at the top of the first stack and the top ring situated at the top of the second stack;
    wherein the loader device is configured such that the preforms are stacked between the first and the second non-porous walls and a bottom end of each preform stands on a bottom ring of the first stack so that the porous preforms are engaged one in another, while leaving spaces between each of the preforms, said spaces forming respective volumes for passing a flow of reagent gas on either side of each preform, the injection orifices of a bottom ring of the first stack being configured to feed with reagent gas each of said volumes, and the discharge orifices of a top ring of the second stack being configured to discharge the reagent gas out of each of said volumes.

2. A device according to claim 1, wherein it further includes a mast arranged at the center of the support tray and supporting the second stack comprising top rings.

3. A device according to claim 1, wherein it further includes a cover placed on the top ring situated at the top of the second stack.

4. A device according to claim 1, wherein each bottom ring includes a portion that is to support a porous preform for densifying.

5. A device according to claim 1, wherein the bottom rings and the top rings are separated from one another by respective graphite gaskets.

6. An installation for densifying porous preforms of frustoconical shape by chemical vapor infiltration, the installation comprising a reaction chamber, a reagent gas admission pipe situated at a first end of the chamber and leading into a preheater zone, and a discharge pipe situated in the vicinity of a second end of the chamber opposite from the first end,
    wherein the chamber contains a plurality of porous preforms of frustoconical shape mounted in the loader device according to claim 1.

7. An installation according to claim 6, wherein it includes a sealing ring extending between the support tray of the loader device and the inner wall of the reaction chamber.

8. An installation according to claim 7, wherein the sealing ring includes an annular gasket carrier arranged on the support tray and a graphite gasket extending from the outer periphery of said annular gasket carrier, said gasket being in contact with the inner wall of the reaction chamber.

9. An installation according to claim 6, wherein the porous preforms are preforms for aeroengine after-burner parts.

\* \* \* \* \*